United States Patent [19]
Togo et al.

[11] Patent Number: 5,689,182
[45] Date of Patent: Nov. 18, 1997

[54] MAGNETIC SENSOR WITH BOBBIN, SLEEVE AND TERMINAL BED FOR DETECTING A CHANGE IN MAGNETIC FLUX

[75] Inventors: Ichiro Togo; Yasuyoshi Hatazawa, both of Himeji, Japan

[73] Assignee: Mitsubishi Denki Kabushiki Kaisha, Tokyo, Japan

[21] Appl. No.: 629,845

[22] Filed: Apr. 9, 1996

Related U.S. Application Data

[62] Division of Ser. No. 442,176, May 16, 1995, abandoned.

[30] Foreign Application Priority Data

May 17, 1994 [JP] Japan ..................... 6-102985

[51] Int. Cl.$^6$ .............. G01P 3/488; G01B 7/30; H01F 27/29
[52] U.S. Cl. ................... 324/207.15; 29/602.1; 324/774; 336/192
[58] Field of Search .................. 324/173, 174, 324/207.15, 207.16, 207.25, 258; 29/602.1, 605–607; 336/90, 92, 192

[56] References Cited

U.S. PATENT DOCUMENTS

| | | | |
|---|---|---|---|
| 4,829,245 | 5/1989 | Echasseriau et al. | 324/174 |
| 4,847,557 | 7/1989 | Saito et al. | 324/173 |
| 4,931,728 | 6/1990 | Hata et al. | 324/207.15 |
| 5,039,942 | 8/1991 | Buchschmid et al. | 324/174 |
| 5,121,056 | 6/1992 | Onishi et al. | 324/207.15 |
| 5,229,714 | 7/1993 | Brdar et al. | 324/173 |
| 5,363,033 | 11/1994 | Suda et al. | 324/207.15 |
| 5,418,454 | 5/1995 | Togo | 324/207.15 |

FOREIGN PATENT DOCUMENTS

| | | |
|---|---|---|
| 2640049 | 6/1990 | France . |
| 2-616 | 1/1990 | Japan . |
| 3-56877 | 5/1991 | Japan . |
| 5-133966 | 5/1993 | Japan . |

*Primary Examiner*—Gerard R. Strecker
*Attorney, Agent, or Firm*—Sughrue,Mion,Zinn,Macpeak & Seas, PLLC

[57] ABSTRACT

The magnetic sensor comprises a sensor assembly, and a resin molding member surrounding the sensor assembly and defining a housing, the sensor assembly comprising a magnet for generating a magnetic flux, a magnetic core for defining a magnetic circuit, a coil wound around the magnetic core for detecting the change in the magnetic flux flowing through the magnetic core and a support member including a coil bobbin for supporting an assembly of the magnet, the magnetic core and the coil, and the support member comprising an engaging portion which is a surface exposed from the resin molding member for positioning the sensor assembly in a predetermined position during the molding of the resin molding member, so that the sensor assembly can be supported within the resin mold die by the engaging portion between the magnetic core and the coil bobbin or only by the engaging portion of the coil bobbin, so that the stable positioning and support is provided.

3 Claims, 22 Drawing Sheets

COIL WINDING DIRECTION

MAGNETIC SENSOR WITH BOBBIN, SLEEVE AND TERMINAL BED FOR DETECTING A CHANGE IN MAGNETIC FLUX

This is a divisional of application Ser. No. 08/442,176 filed May 16, 1995, now abandoned.

BACKGROUND OF THE INVENTION

This invention relates to a magnetic sensor and, more particularly, to a magnetic sensor for detecting a change in a magnetic flux. Such magnetic sensor is generally employed in position detection and in rotational speed detection.

FIGS. 40 to 48 illustrate a related magnetic sensor to which the magnetic sensor of the present invention pertains, and FIGS. 40 to 43 are views illustrating an example of employment of the related magnetic sensor. In the related magnetic sensor 1, reference numeral 2 is a cylindrical magnetic core, 3 is a coil wound between flanges 5 and 6 on a bobbin 4 on the magnetic core 2, 7 is a cylindrical sleeve (a guide portion) integral with the bobbin 4, 8 is a cylindrical permanent magnet, 9 is a spacer disposed on the magnet 8, 10 and 11 are lead out wires drawn from the coil 3, 12 is a tape for securing the lead out wires 10 and 11 on the sleeve 7, and 13 is a terminal disposed at the other end of the sleeve 7 extending through it, at one end of which the lead out wires 10 are wound and electrically connected by means of solder (not shown) for example and, the other end extending into the connector portion 15 of the housing 14 of the magnetic sensor.

The housing 14, which is a resin molded member which surrounds a sensor assembly composed of the magnetic core 2, the coil 3, the magnet 8 or the like of the magnetic sensor, comprises the above-mentioned connector portion 15, a main body portion 16 containing therein the sensor assembly and a mounting bracket 17. The mounting bracket 17 has formed therein a positioning pin 18 and a hole 19 for receiving therein a mounting screw (not shown). The magnetic sensor 1 is secured to a predetermined position with its main body portion 16 inserted into the circular mounting hole 21 formed in the support structure 20, the positioning pin 18 of the mounting bracket 17 inserted into a positioning hole 22 of the support structure 20, and a mounting screw 24 extended through the hole 19 for receiving the mounting screw and thread-engaged with the threaded hole 23 of the support structure 20.

The magnetic sensor 1 is attached and used, as shown in FIG. 40, in a position where the tip of the magnetic core 2 can be positioned to oppose to the tip of the projection 25 of the rotary member 26 which is a signal detecting magnetic plate. In such state, the magnetic flux from the magnet 8 extends through a magnetic circuit including the magnetic core 2, and the projection 25 of the rotary member 26 periodically comes to the position opposite to the tip of the magnetic core 2 depending upon the rotation of the rotary member 26. According to whether or not the projection 25 is at this position, the magnetic reluctance of the magnetic circuit changes, so that the magnitude of the magnetic flux flowing through the magnetic core 2 changes. This change in magnetic flux is converted into voltage by the coil 3 and outputted from the connector 15. In order to concentrate the magnetic flux generated from the magnetic core to improve the position detection accuracy of the magnetic sensor, the tip surface of the magnetic core and the projection 25 of the rotary member 26 are made substantially the same size and the same configuration, the mounting of the magnetic sensor is carefully achieved by means of the positioning pin 18 or the like so that the tip surface of the magnetic core and the projection 25 are positioned in an accurate opposition.

FIG. 43 is a sectional view taken along line A—A of FIG. 40, FIG. 44 is an enlarged view of the portion from which the lead out wire 10 is extended from the bobbin 4 of FIG. 40, and FIG. 45 is a view illustrating the state in which the lead out line 10 is drawn from the bobbin 4 and wired on the sleeve 7.

The bobbin 4 employed in the cylindrical magnetic sensor 1 comprises a winding core 27 (see FIG. 40) on which the coil 3 is wound and two disc-shaped flanges 5 and 6 disposed at each ends of the core, the flange 6 having formed therein lead out ports 28 and 29 for the lead out wires 10 and 11. The lead out ports 28 and 29 are notches spaced apart from each other and extending inwardly in the substantially radial direction from the outer edge of the flange 6. In the illustrated example, the lead out wire 10 enters from the inner end of the lead out port 28, wound and laminated in layers on the bobbin 4 into the coil 3 and extends out from the outer periphery of the coil 3 to be lead out from the outer end of the lead out port 29 as the lead out wire 11. Therefore, as best seen from the figures, the lead out wire 11 extends outwardly from the flange 6 at the radially outside position of the lead out port 29 and extends radially inwardly onto the sleeve 7 and axially extends on the sleeve 7 together with the lead out wire 10 and secured by the tape 12 and finally wound around the terminal 13 at the other end of the sleeve 7.

Thus, since the lead out wire 11 particularly has a portion extending in radial direction, a tensile stress is applied to the lead out wire 11, and since a pressure is applied due to the molten resin during the molding of the resin mold 16 which is a housing, the lead out wire 11 may be broken. Also, the lead out wire 11 passes at the shallow portion of the lead out port 29, so that the lead out wire 11 may come out of the lead out port 29 and dislocated.

The lead out wires 10 and 11 are secured by solder after they are wound around the terminal 13 at the connection portion, but they are easily damaged during the soldering because of burnt or molten bobbin 4 or sleeve 7 by a hot solder or a soldering iron. Also, since the connection portion is disposed within the cylindrical housing main body 16, the connection portion is arranged not to protrude radially outwardly of the bobbin 4. Therefore, the impregnation into a solder bath cannot be employed for the soldering, the soldering iron had to be manually operated, obstacling an automation of the soldering and increasing the cost of the product.

FIG. 45 is a partial plan view of the sensor assembly in which the coil 3 is wound on the bobbin 4 and the wiring of the lead out wires 10 and 11 by the tape 12 is complete. The tape 12 used must be an expensive heat resisting tape which is resistive to a high temperature occurring during the soldering and the resin molding, resulting in one reason that the product cost cannot be decreased. Also, since the wiring operation by means of the tape 12 must be carried out before the winding and soldering to the terminal 13, i.e., immediately after the winding of the coil 3, this operation must be done by a special device only for this purpose or an independent separate step by hands.

FIG. 46 is a schematic sectional view showing the molding die for use in the resin molding step for the related magnetic sensor 1, from which it is seen that the sensor assembly composed of the magnetic core 2, the coil 3, the bobbin 4 see (FIG. 40), the sleeve 7 (see FIG. 40), the magnet 8, the spacer 9 and the like is housed and supported within a cavity 33 defined by the mold dies 30, 31 and 32. That is, the tip of the magnetic core 2 is intimately fitted into the recessed portion 34 formed in the bottom surface of the cylindrical cavity of the lower die 30, the upper end portion which becomes the connector 15 of the terminal 13 is inserted into and held by the die insert 31 and the upper die 32 is placed over them to define the cavity 33, whereby the sensor assembly is held in a predetermined position within the cavity 33.

In the magnetic sensor which employs such the resin molding die, the magnetic core 2 is moved during the resin molding by the pressure of the injected resin and its center line tilts and offsets, causing an unstable output of the magnetic sensor, resulting in the significant decrease of the value of the product. Also, since the terminal 13 is supported by the die insert 31, the terminal is bent by the pressure of the injected resin.

On the other hand, when the signal output from the magnetic sensor 1s taken out from the lead wires rather than from the terminal 13, the sensor assembly is supported at only one point by the magnetic core 2 within the die cavity 33, the support is unstable and the resin molding operation is difficult.

In order to obtain a stable support of the assembly within the die cavity, it has been proposed to make the recessed portion 34 of the lower die 30 deep and make the projection portion of the magnetic core 2 sufficiently long. However, when the magnetic core 2 has an increased length in the magnetic circuit of the magnetic sensor 1, the magnetic reluctance is accordingly increased and the signal output from the magnetic sensor 1 is decreased. Further, with the elongated projection of the magnetic core 2, its exposed surface is increased, so that magnetic foreign matters such as iron powders or the like is easily attracted to the exposed surface, providing a change in the magnetic circuit of the magnetic sensor 1 and causing the decrease in the signal output and the shift of the signal generating timing.

Also, in the example illustrated in FIG. 47, one portion of the spacer 9 is outwardly extended from the sleeve 7 in the axial direction of the sensor assembly when there may be a restriction in the axial dimension of the completed magnetic sensor. In such case, the abutment area or the contact area between the spacer 9 and the sleeve 7 is small and the stability of the spacer 9 during the resin injection for the resin molding is poor, so that the spacer 9 and the sleeve 7 must be secured by a cyan-system bonding agent for example. If the bonding agent is used, the number of manufacturing steps is increased and the product cost is increased. Further, the injected bonding agent passes through the gap between the sleeve 7 and the spacer 9 to reach between the spacer 9 and the magnet 8 where it forms a thin film of the bonding agent or a non-magnetic gap increasing the magnetic reluctance between the magnet 8 and the spacer 9, causing a decrease in the output from the magnetic sensor.

Also, the related magnetic sensor illustrated in FIG. 47 has a sealing function which is provided by, as shown in FIG. 41, the main body portion 16 of the magnetic sensor inserted into the mounting hole 21 formed in the support structure 20 to hermetically seal therebetween. For this purpose, an O-ring 36 for intimately contacting with the inner circumferential surface of the mounting hole 21 of the support structure 20 is placed within a circumferential groove 35 around the housing main body portion 16.

In FIG. 48, a mold die for use in the resin molding step for manufacturing the magnetic sensor having the above-mentioned O-ring 36, wherein the mold die for forming the resin mold 14 which is the housing is arranged to be oriented within the cavity 33 with the axis of the sensor assembly horizontally and with the connector portion 15 downward, and a die insert 38 for the connector 15 is inserted into the lower die 37 and two separable upper dies 39 and 40 are arranged in the lower die 37. The axis of the sensor assembly is horizontally arranged in order not to form an under cut at the circumferential groove 35 in the housing main body portion 16.

When the sensor assembly in which the spacer 9 projects from the sleeve 7 is horizontally placed within the molding die, the spacer 9 comes out of the sleeve 7 much more easily, so that the previously mentioned bonding agent must be used for secure attachment, lowering the handling efficiency and increasing the cost of the manufactured product as well as degrading the sensitivity of the manufactured magnetic sensor.

Further in the resin molding of the magnetic sensor, for the purpose of miniaturizing the magnetic sensor and reducing the diameter of housing main body portion, as shown in FIGS. 40 and 47, the thickness of the housing main body portion 16 is made thin at the portion where the coil 3 is housed and is made particularly thin at the portion of the flanges 5 and 6 of the bobbin 4. In order to obtain such the arrangement, the clearances defined between the mold die for the resin molding and the flanges 5 and 6 are made small. Therefore, during the resin molding, the injected resin is difficult to enter into this clearances and even a cavity due to incomplete resin molding may be generated due to the poor resin flow. In order improve resin flow, proposition has been made to increase the resin injection speed or to increase the resin molding pressure, for example, another problem of breaking the lead out wires 10 and 11 drawn from the lead out wire ports 28 and 29 (FIG. 43) of the flange 6 of the bobbin 4 because of the pressure of the resin.

Also, with respect to the positioning of the mounting bed or the like relative to the support structure 20, in the magnetic sensor in which the magnetic sensor is positioned by the projection disposed to the mounting bracket with the mounting bracket disposed placed within a plane parallel to the axis of the magnetic sensor and without inserting the main body portion which houses the sensor assembly into the through hole of the support structure, there was a problem that the distance between the tip of the magnetic core and the positioning projection is increased to degrade the positioning accuracy of the magnetic core tip by the positioning projection. Further, when the positioning projection is to be attached to the mounting bracket as an element separate from the mounting bracket, the number of the components is increased and an assembling of the positioning projection to the mounting bracket is necessary which increases the operation steps, increasing the cost of the product manufactured.

Further, as an example of the positioning, the inner diameter of the through hole for receiving therein screws of the mounting bracket may be made slightly greater than the outer diameter of the thread portion (not shown) of the mounting screw and the mounting screw may be inserted into the through hole, whereby the magnetic sensor is positioned and secured. In this case, the dimension allowance of the inner diameter of the through hole must be made small. Therefore, the machining of the through hole is difficult, requiring the use of a machined bush metal or the like, which causes the increase of the manufacturing cost.

This invention has been made to solve the above-discussed problems of the related magnetic sensor to which the present invention pertains and has as its object the provision of the magnetic sensor which can be easily manufactured at low cost and has a high accuracy and reliability.

SUMMARY OF THE INVENTION

With the above object in view, the magnetic sensor of the present invention of embodiment 1, comprises a sensor assembly, and a resin molding member surrounding the sensor assembly and defining a housing, the sensor assembly comprising a magnet for generating a magnetic flux, a magnetic core for defining a magnetic circuit, a coil wound around the magnetic core for detecting the change in the magnetic flux flowing through the magnetic core and a support member including a coil bobbin for supporting an assembly of the magnet, the magnetic core and the coil, and the support member comprising an engaging portion which is a surface exposed from the resin molding member for positioning the sensor assembly in a predetermined position during the molding of the resin molding member.

In the magnetic sensor of embodiment 1, the engaging portion includes a projection disposed next to the coil bobbin.

In the magnetic sensor of embodiment 3, the coil bobbin comprises a flange including lead out ports for allowing lead out wires to extend therethrough, and the lead out ports are circumferentially spaced apart from each other on the flange to prevent a contact of the lead out wires passing therethrough.

The magnetic sensor of embodiment 3 comprises a sensor assembly, and a resin molding member surrounding the sensor assembly and defining a housing, the sensor assembly comprising a magnet for generating a magnetic flux, a magnetic core for defining a magnetic circuit, a coil wound around the magnetic core for detecting the change in the magnetic flux flowing through the magnetic core and a support member including a coil bobbin for supporting an assembly of the magnet, the magnetic core and the coil, and the coil bobbin comprising a flange including lead out ports for allowing lead out wires to extend therethrough, and the lead out ports are circumferentially spaced apart from each other on the flange to prevent a contact of the lead out wires passing therethrough.

In the magnetic sensor of embodiment 4, the axes of the lead out ports are inclined relative to the flange so they are at an acute angle relative to the direction of lead out wire winding direction on the coil bobbin.

The magnetic sensor as of embodiment 3 comprises a sensor assembly, and a resin molding member surrounding the sensor assembly and defining a housing, the sensor assembly comprising a magnet for generating a magnetic flux, a magnetic core for defining a magnetic circuit, a coil wound around the magnetic core for detecting the change in the magnetic flux flowing through the magnetic core and a support member for supporting an assembly of the magnet, the magnetic core and the coil, the support member comprising a coil bobbin for receiving therein the magnetic core, a sleeve connected at its one end to the coil bobbin and receiving the magnet therein and a terminal disposed at the other end of the sleeve and connected to the coil, and the coil bobbin comprising a flange including lead out ports for allowing lead out wires to extend therethrough, and the lead out ports are circumferentially spaced apart from each other on the flange to prevent a contact of the lead out wires passing therethrough.

In the magnetic sensor of embodiment 7, the sleeve has formed therein a circumferential groove and the lead out wires are wound into the circumferential groove.

In the magnetic sensor of embodiment 8, the sleeve has formed therein an axial groove and the lead out wires are wound into the axial groove.

In the magnetic sensor of embodiment 9, the sleeve comprises an engaging projection and the lead out wires are wound around the engaging projection and wound onto the sleeve.

In the magnetic sensor of embodiment 10, the engaging projection comprises an engaging groove and the lead out wires extend through the engaging groove.

The magnetic sensor of embodiment 11 comprises a sensor assembly, and a resin molding member surrounding the sensor assembly and defining a housing, the sensor assembly comprising a magnet for generating a magnetic flux, a magnetic core for defining a magnetic circuit, a coil wound around the magnetic core for detecting the change in the magnetic flux flowing through the magnetic core and a support member for supporting an assembly of the magnet, the magnetic core and the coil, the support member comprising a coil bobbin for receiving therein the magnetic core, a sleeve connected at its one end to the coil bobbin and receiving the magnet therein, a terminal bed disposed at the other end of the sleeve and a terminal disposed to the terminal bed and connected to the coil, and the terminal bed has formed therein a recessed portion.

The magnetic sensor of embodiment 12 comprises a sensor assembly, and a resin molding member surrounding the sensor assembly and defining a housing, the sensor assembly comprising a magnet for generating a magnetic flux, a magnetic core for defining a magnetic circuit, a coil wound around the magnetic core for detecting the change in the magnetic flux flowing through the magnetic core and a support member for supporting an assembly of the magnet, the magnetic core and the coil, the support member comprising a coil bobbin for receiving therein the magnetic core, a sleeve connected at its one end to the coil bobbin and receiving the magnet therein and a terminal disposed at the other end of the sleeve and connected to the coil, and the terminal projects radially outward of the outer diameter of the coil bobbin.

The magnetic sensor of embodiment 13 comprises a sensor assembly, and a resin molding member surrounding the sensor assembly and defining a housing, the sensor assembly comprising a magnet for generating a magnetic flux, a magnetic core for defining a magnetic circuit, a coil wound around the magnetic core for detecting the change in the magnetic flux flowing through the magnetic core and a support member for supporting an assembly of the magnet, the magnetic core and the coil, the support member comprising a coil bobbin for receiving therein the magnetic core, a sleeve connected at its one end to the coil bobbin and receiving the magnetic core and the magnet therein, a spacer for holding the magnetic core and the magnet within the sleeve and a terminal disposed at the other end of the sleeve and connected to the coil, and the sleeve has provided on its inner circumferential surface with a small-diameter portion for holding the spacer by pressure fit.

In the magnetic sensor of embodiment 13, the small-diameter portion is a projection projected from the inner peripheral surface of the spacer.

The magnetic sensor of embodiment 14 comprises a sensor assembly, and a resin molding member surrounding the sensor assembly and defining a housing, the sensor assembly comprising a magnet for generating a magnetic flux, a magnetic core for defining a magnetic circuit, a coil wound around the magnetic core for detecting the change in the magnetic flux flowing through the magnetic core and a support member for supporting an assembly of the magnet, the magnetic core and the coil, the support member comprising a coil bobbin for receiving therein the magnetic core and a sleeve connected at its one end to the coil bobbin and receiving the magnetic core and the magnet therein, and further comprising between the magnetic core and the sleeve a positioning means engaging each other for positioning the magnetic core relative to the sleeve.

The magnetic sensor of embodiment 15 comprises a sensor assembly including a magnetic core, and a resin molding member surrounding the sensor assembly and defining a housing for the magnetic sensor, the resin molding member comprising a positioning means disposed in the vicinity of the magnetic core.

In the magnetic sensor of embodiment 15, the positioning means comprises a positioning pin extending at right angles relative to the axis of the magnetic sensor.

The magnetic sensor of embodiment 16 comprises a sensor assembly including a magnetic core, a resin molding member surrounding the sensor assembly with one end of the magnetic core projected and defining a housing for the magnetic sensor, and a cover at least partially surrounding a side surface of the one end of the magnetic core projected from the resin molding member.

The magnetic sensor of embodiment 17 comprises a sensor assembly, and a resin molding member surrounding the sensor assembly and defining a housing, the sensor assembly comprising a magnet for generating a magnetic flux, a magnetic core for defining a magnetic circuit, a coil wound around the magnetic core for detecting the change in the magnetic flux flowing through the magnetic core and a support member for supporting an assembly of the magnet, the magnetic core and the coil, the support member comprising a coil bobbin for receiving therein the magnetic core, a sleeve connected at its one end to the coil bobbin and receiving the magnetic core and the magnet therein, a spacer for holding the magnetic core and the magnet within the sleeve, a terminal disposed at the other end of the sleeve and connected to the coil and a cap for holding the spacer within the sleeve.

The magnetic sensor of embodiment 18 comprises a sensor assembly, and a resin molding member surrounding the sensor assembly and defining a housing, the sensor assembly comprising a magnet for generating a magnetic flux, a magnetic core for defining a magnetic circuit, a coil wound around the magnetic core for detecting the change in the magnetic flux flowing through the magnetic core and a support member including a coil bobbin for supporting an assembly of the magnet, the magnetic core and the coil, and the coil bobbin comprising a resin passage for allowing the flow of molten resin therethrough during the resin molding.

In the magnetic sensor of embodiment 1, the sensor assembly can be supported within the resin mold die by the engaging portion between the magnetic core and the coil bobbin or only by the engaging portion of the coil bobbin, so that the stable positioning and support is provided.

In the magnetic sensor of embodiment 1, the sensor assembly can be stably positioned and supported and the rotation of the sensor assembly about its central axis can be prevented.

In the magnetic sensor of embodiment 3, the sensor assembly can be stably positioned and supported and the rotation of the sensor assembly about its central axis can be prevented and further the danger of contacting and short-circuiting between the lead out wires on the support member can be eliminated.

In the magnetic sensor of embodiment 3, the danger of contacting and short-circuiting between the lead out wires on the support member can be eliminated.

In the magnetic sensor of embodiment 4, the lead out wires are not folded at the flange of the coil bobbin eliminating the cause of wire breaking.

In the magnetic sensor of embodiment 3, there is a danger of contacting and short-circuiting between the lead wires between the coil bobbin of the support member and the terminal.

In the magnetic sensor of embodiment 7, the lead out wires are not axially dislocated on the sleeve, preventing the short-circuiting and the wire breaking fault due to the contact between the lead out wires.

In the magnetic sensor of embodiment 8, the lead out wires are not circumferenetially dislocated on the sleeve, preventing the short-circuiting and the wire breaking fault due to the contact between the lead out wires.

In the magnetic sensor of embodiment 9, the lead out wires are not circumferentially dislocated on the sleeve, preventing the short-circuiting and the wire breaking fault due to the contact between the lead out wires.

In the magnetic sensor of embodiment 10, the lead out wires are not axially nor circumferentially dislocated on the sleeve, preventing the short-circuiting and the wire breaking fault due to the contact between the lead out wires.

In the magnetic sensor of embodiment 11, the interface facing to the resin molding member has a complex configuration and a large surface area, providing a good contact.

In the magnetic sensor of embodiment 12, the solder impregnation into a solder bath can be carried out, making the soldering easier and allow the automation.

In the magnetic sensor of embodiment 13, the magnetic core, the magnet and the spacer are supported within the support member by pressure fit without using the bonding agent, allowing the automization.

In the magnetic sensor of embodiment 13, the insertion for the pressure fit is easy.

In the magnetic sensor of embodiment 14, the stop for the rotation of the magnetic core relative to the sleeve can be provided to allow a higher accuracy of the magnetic sensor.

In the magnetic sensor of embodiment 15, the positioning can be achieved at a very high accuracy.

In the magnetic sensor of embodiment 15, the magnetic sensor can be arranged in parallel to the mounting bed without the need for passing through the mounting bed as done in the related sensor, allowing a higher degree of freedom in arrangement.

In the magnetic sensor of embodiment 16, the magnetic attraction of any magnetic foreign matters to the magnetic core can be prevented, preventing the degrading of the signal accuracy of the magnetic sensor and improving the erosion resistivity.

In the magnetic sensor of embodiment 17, the magnetic core, the magnet and the spacer can be held within the sleeve before resin molding, so that the automization can be achieved.

In the magnetic sensor of embodiment 18, the molten resin is not obstacled by the coil bobbin during the resin molding, improving the flow of the molten resin, allowing the magnetic sensor to be made small and improving the yield of the product.

BRIEF DESCRIPTION OF THE DRAWINGS

The present invention will become more readily apparent from the following detailed description of the preferred embodiments of the present invention taken in conjunction with the accompanying drawings, in which.

DESCRIPTION OF THE PREFERRED EMBODIMENTS

EMBODIMENT 1.

Figure 1:
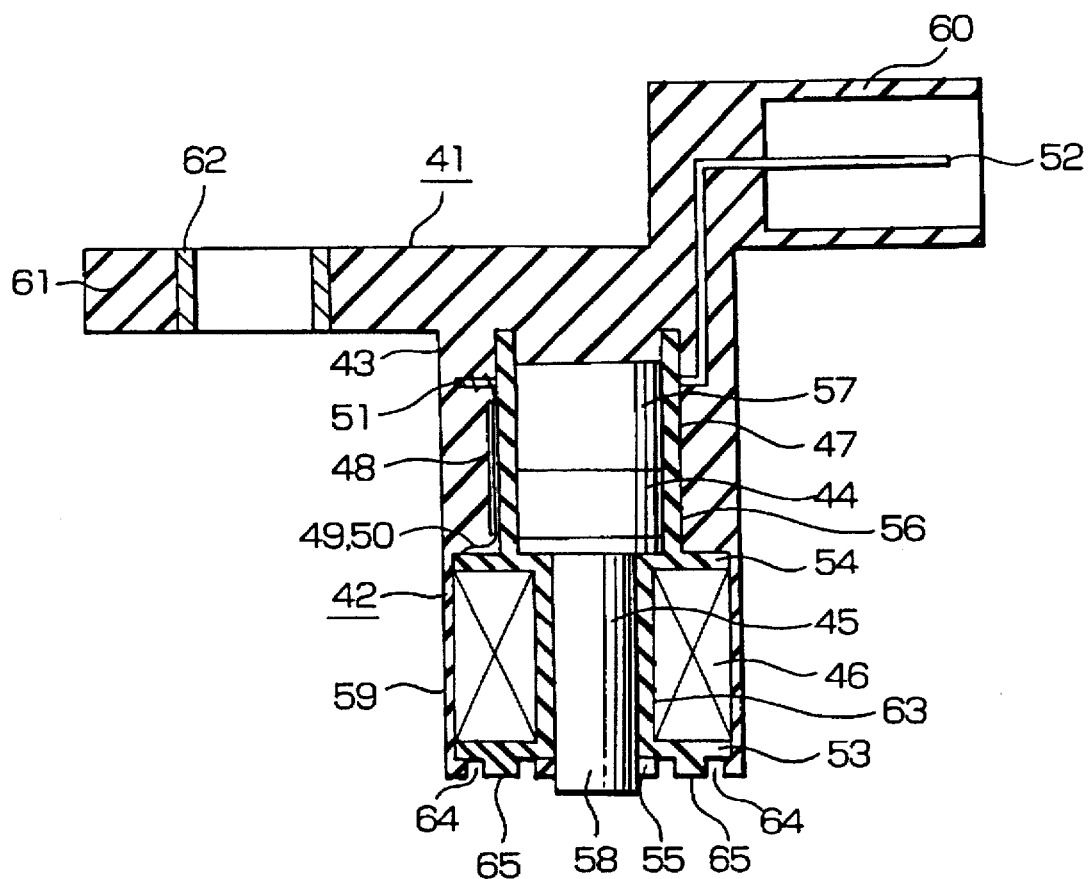
FIG. 1 is a sectional view illustrating one embodiment of the magnetic sensor of the present invention.
Figure 2:
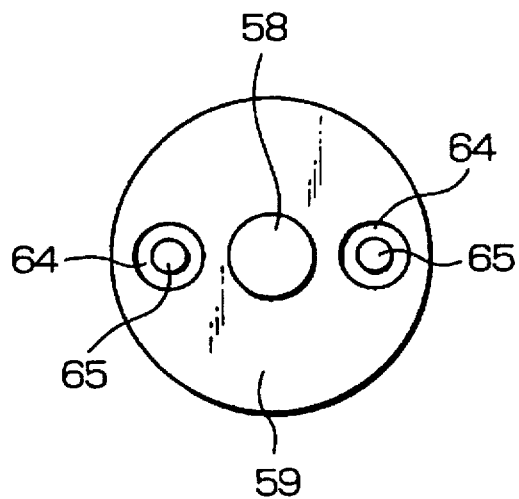
FIG. 2 is an end view illustrating the engaging portion for the positioning of the magnetic sensor of FIG. 1.
Figure 3:
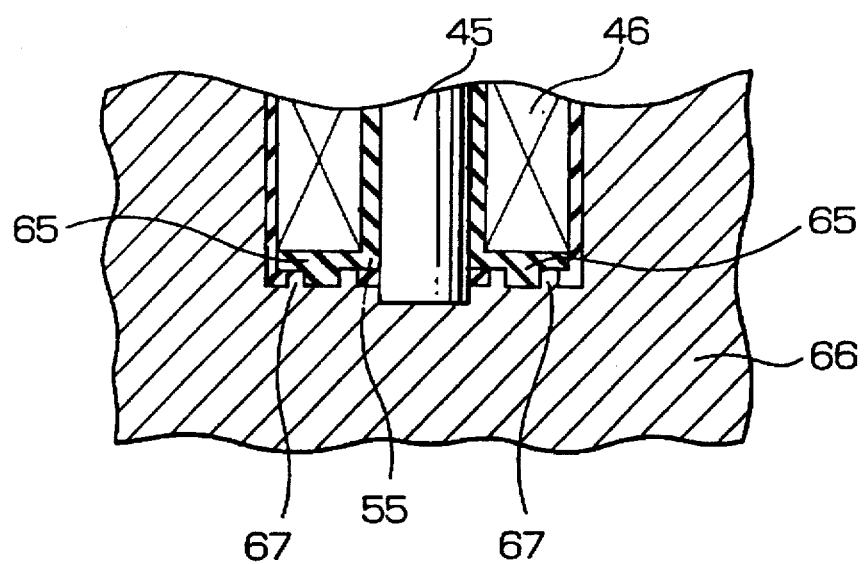
FIG. 3 is a fragmental sectional view illustrating the sate in which the magnetic sensor of FIG. 1 is placed in the mold die.
Figure 40:
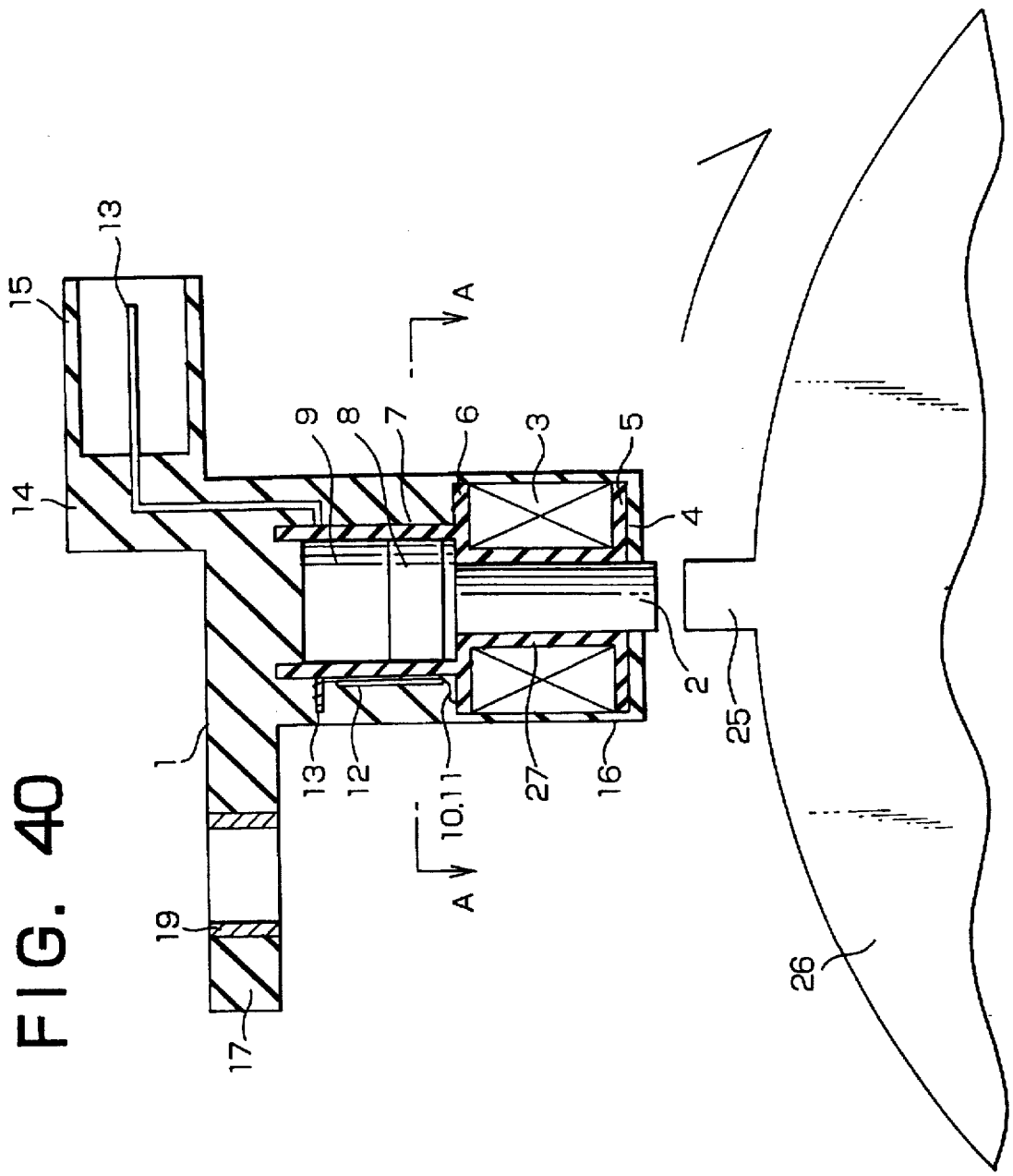
FIG. 40 is a sectional view showing the related magnetic sensor to which the present invention pertains.
Figure 41:
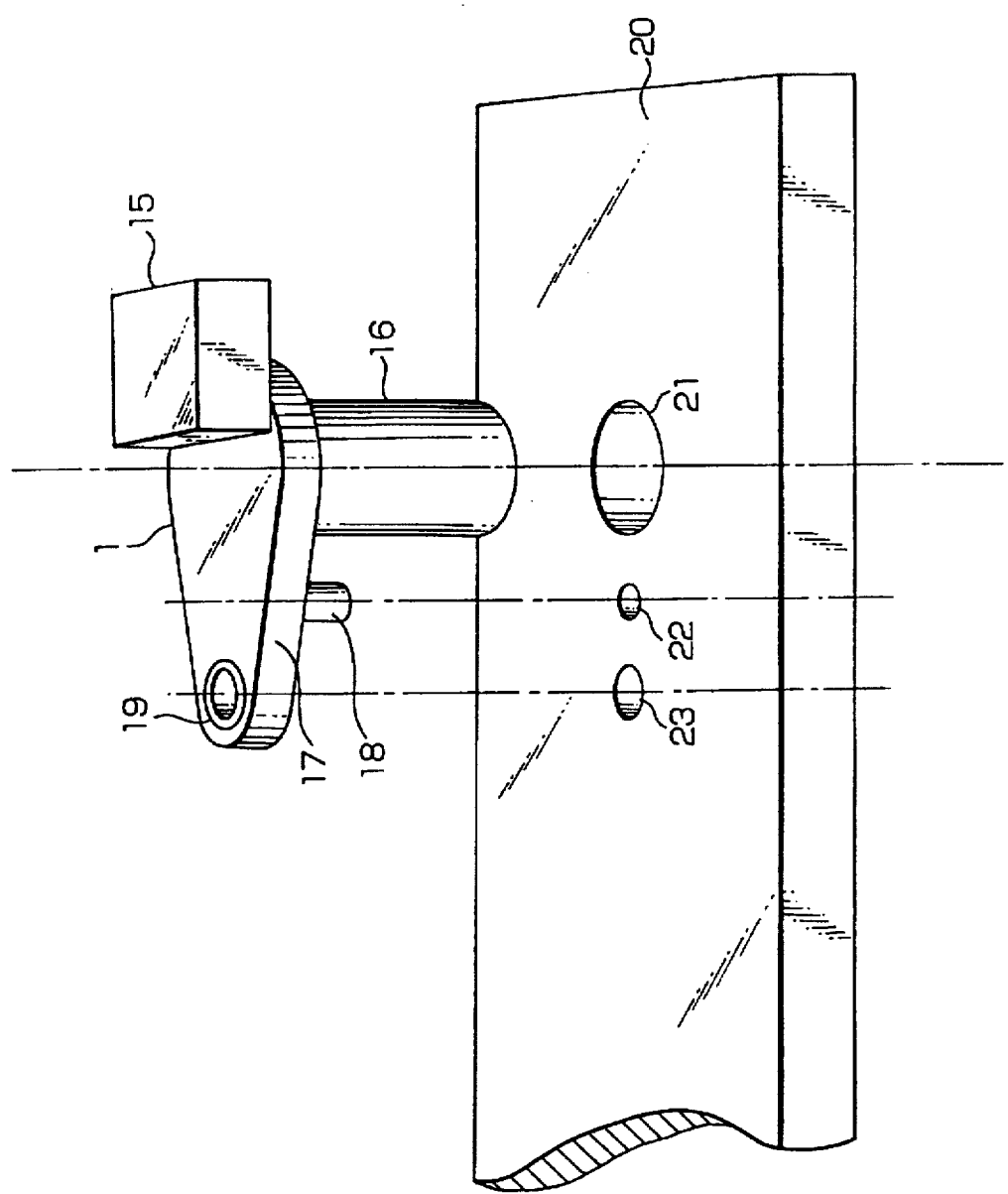
FIG. 41 is a perspective view showing the related magnetic sensor shown in FIG. 40.

FIGS. 1 to 3 illustrate an embodiment of the magnetic sensor of the present invention. The magnetic sensor 41 of the present invention, which has a general construction similar to the magnetic sensor shown in FIGS. 40 to 42, comprises a sensor assembly 42 and a resin molding member 43 disposed to surround the sensor assembly 42 and defining a housing for the magnetic sensor 41.

The sensor assembly 42 comprises a relatively thick, disc-shaped permanent magnet 44 for generating a magnetic flux, a magnetic core 45 defining a magnetic circuit for the magnetic flux, a coil 46 wound around the magnetic core 45 for detecting the changes in the magnetic flux flowing through the magnetic core 45, a support member 47 supporting the magnet 44, the magnetic core 45 and the coil 46 into an assembly 42 in a predetermined electromagnetic induction relationship, and a terminal 52 having a connection portion 51 to which the lead out wires 49 and 50 drawn from the coil 46 to be attached by the tape 48 onto the support member 47 are connected. The support member 47 comprises a bobbin 55 fitted over the magnetic core 45 and having flanges 53 and 54 disposed at the opposite ends of the bobbin core 63 around which the coil 46 is wound, a cylindrical sleeve 56 integrally extending from the bobbin 55 in the axial direction and having the magnet 44 received therein, and a spacer 57 made of a magnetic material inserted into the sleeve 56 for holding the magnet 44 in position. The integrally molded bobbin 55 and the sleeve 56 may be manufactured from a suitable material such as PBT (polybuthylenetelephtalate), PP (polypropylene), nylon, epoxy resin or the like.

Figure 42:
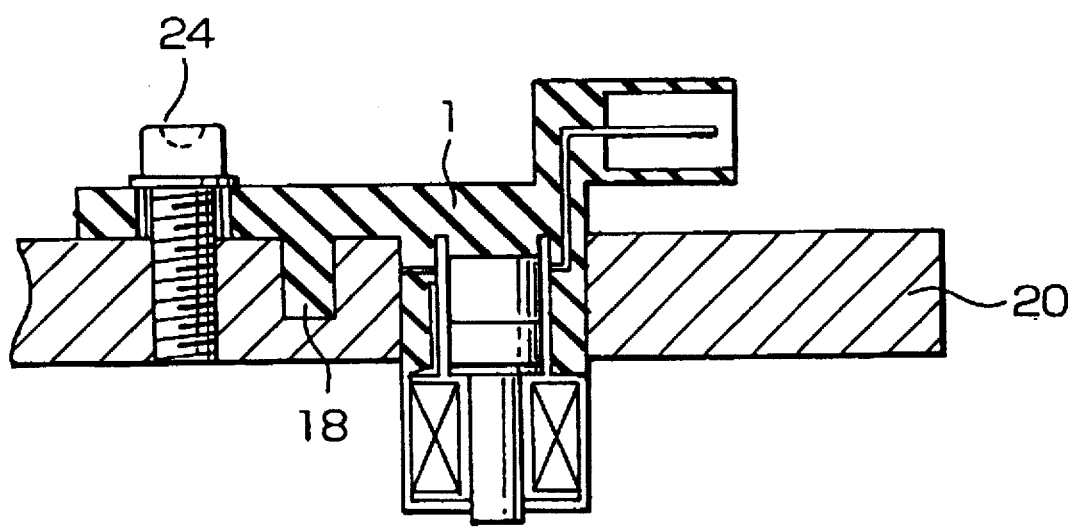
FIG. 42 is a sectional view showing the manner in which the related magnetic sensor shown in FIG. 40 is mounted.
Figure 43:
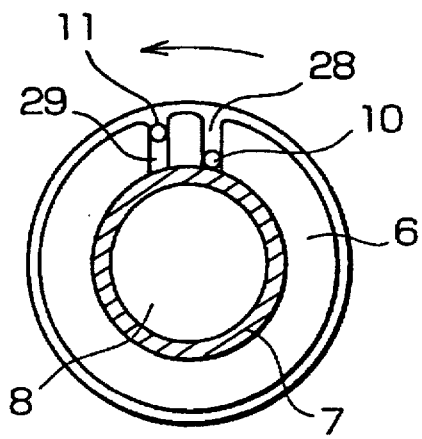
FIG. 43 is a sectional view showing the flanges of the coil bobbin of the related magnetic sensor shown in FIG. 40.
Figure 44:
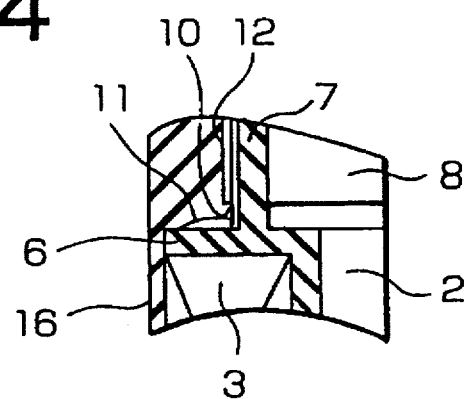
FIG. 44 is a sectional view showing the wiring state in the sensor assembly of the related magnetic sensor shown in FIG. 40.
Figure 45:
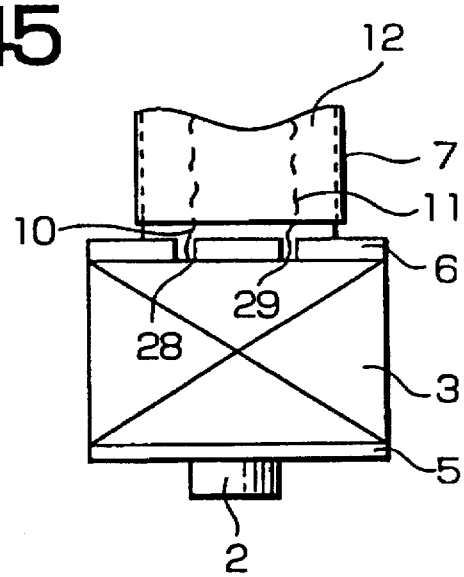
FIG. 45 is a side view showing the wiring state in the sensor assembly of the related magnetic sensor shown in FIG. 40.
Figure 46:
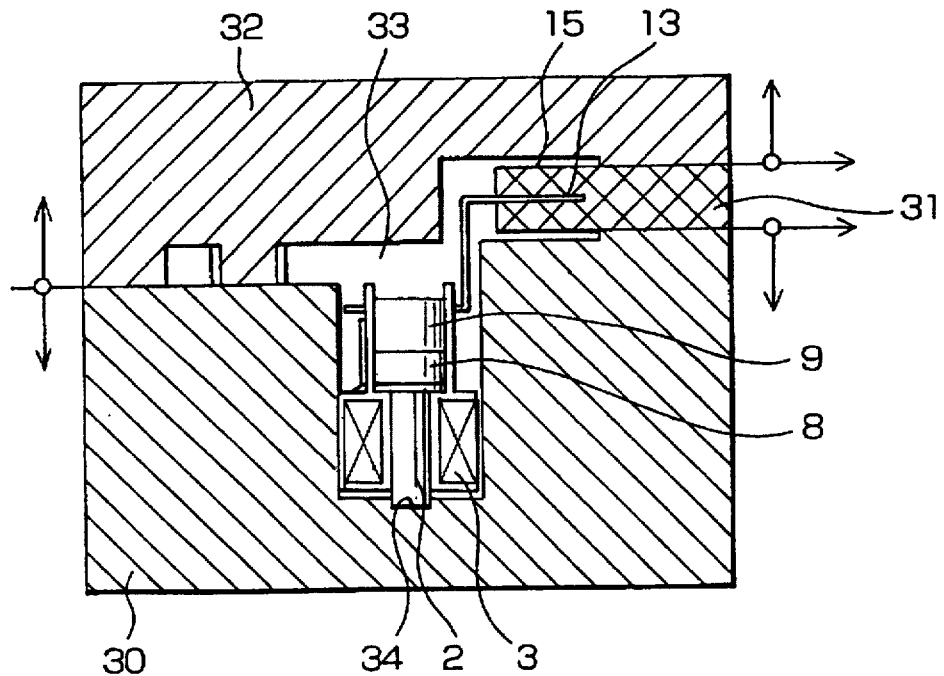
FIG. 46 is a sectional view showing the resin molding step for the related magnetic sensor shown in FIG. 40.
Figure 47:
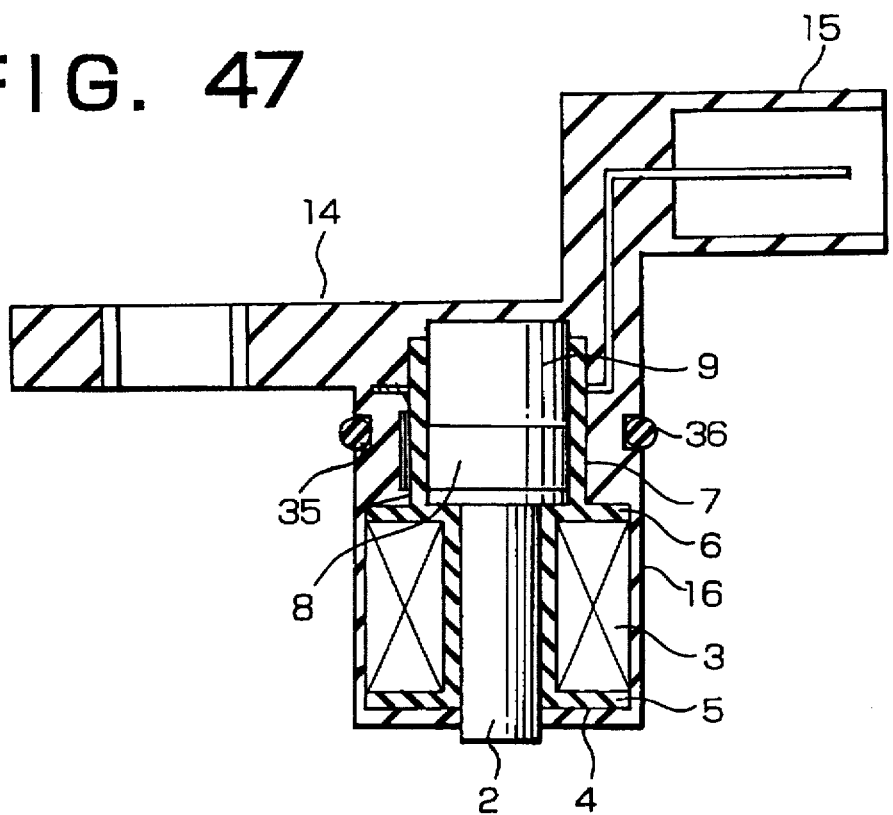
FIG. 47 is a sectional view showing another example of the related magnetic sensor.
Figure 48:
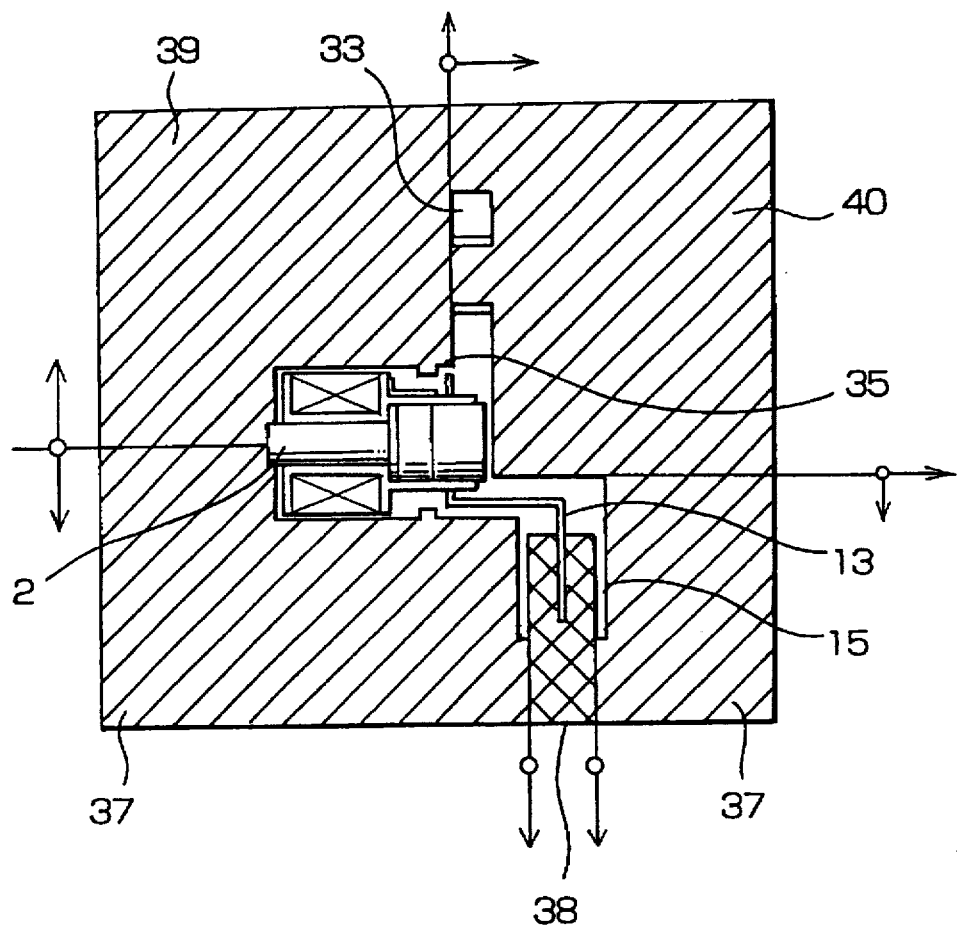
FIG. 48 is a sectional view showing the resin molding step for the related magnetic sensor shown in FIG. 47.

The resin molding member 43 which is the housing of the magnetic sensor 41 is made of the same material as that of the support member 47. The resin molding member 43 comprises a cylindrical main body portion 59 surrounding and covering substantially the entirety of the sensor assembly 42 except for the tip 58 of the magnetic core 45, a connector portion 60 radially extending from the main body portion 59 and having in its inside the terminal 52, and a mounting bracket 61 radially extending from the main body portion 59 in the direction opposite to the connector portion 60. The mounting bracket 61 has formed therein a mounting hole 62 with a bushing metal for allowing the mounting screw to extend therethrough for securing the mounting bracket 61 to the support structure as shown in FIG. 42.

According to the present invention, the magnetic sensor 41 comprises an engaging portion 65 which is exposed from two circular openings 64 located at the end face of the main body portion 59 of the resin molding member 43. This engaging portion 65, which is a projected surface shown in FIGS. 1 to 3 in this example, fits into and engages with the recessed portion defined by two annular projections 67 disposed next to the die 66 for positioning and supporting the sensor assembly 42 in a predetermined position within the molding die 66. The engaging portion 65 is circular in plan, but may be in any other suitable shape.

In the magnetic sensor 42 thus constructed, the support within the mold die 66 is provided not only by the engagement between the tip portion 58 of the magnetic core 45 and the recessed portion of the mold die 66, but also by the engagement between the engaging portion 65 which is two projected surfaces formed in the flange 53 of the bobbin 55 and the annular projection 67 of the mold die 66, so that the positioning and support against the tilt of the axis and the rotation about the axis of the sensor assembly 42 within the mold die 66 are stable and accurate.

Figure 49:
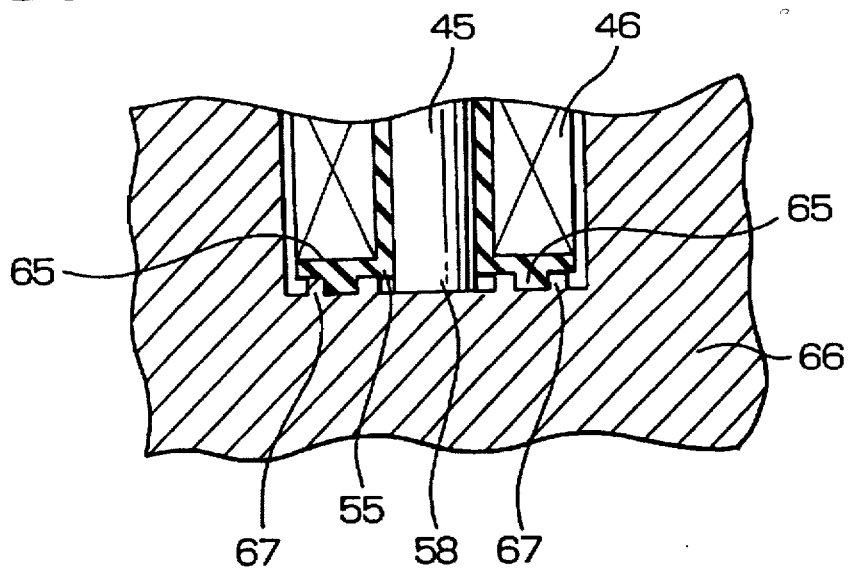
FIG. 49 is a sectional view showing a modified example of the magnetic sensor of the present invention shown in FIG. 3.

Further, the positioning and supporting are possible by the engagement only between the engaging portion 65 and the annular projection 67 of the mold die 66, and as in the magnetic sensor shown in FIG. 49, similar advantageous result can be obtained without the need for the tip 58 of the magnetic core 45 to be engaged and supported by the molding die 66.

EMBODIMENT 2.

Figure 4:
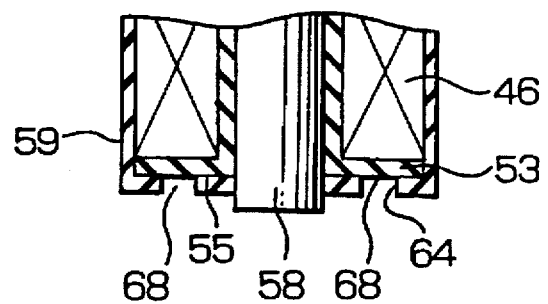
FIG. 4 is a fragmental sectional view illustrating a modified engaging portion for the positioning of the magnetic sensor of the present invention.
Figure 5:
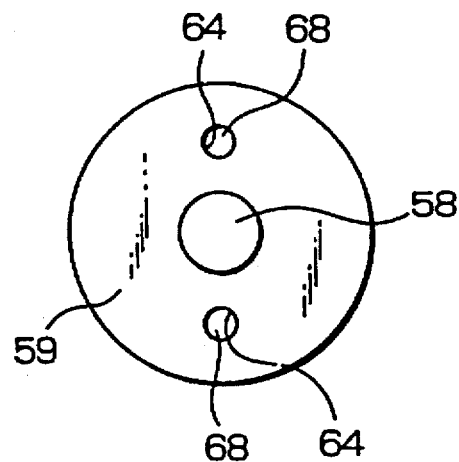
FIG. 5 is an end view showing the engaging portion of the magnetic sensor of FIG. 4.
Figure 6:
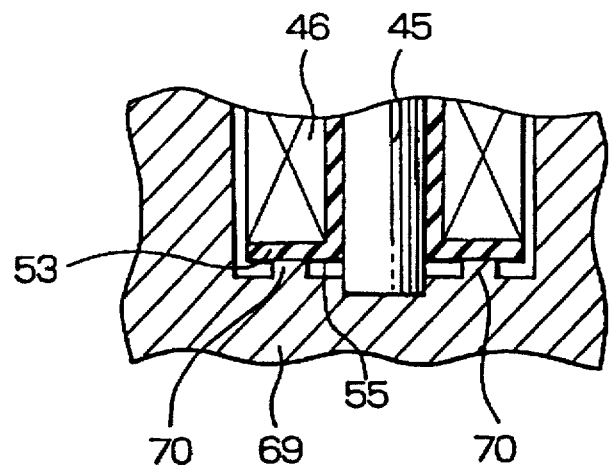
FIG. 6 is a fragmental sectional view showing the state in which the engaging portion of the magnetic sensor of FIG. 4 is placed within the mold die.

In the magnetic sensor shown in FIGS. 4 to 6, the flange 53 of the coil bobbin 55 of the support member 47 is, similarly to the engaging portion 65 of FIGS. 1 to 3, provided with an engaging portion 68 exposed through the two circular openings 64 disposed in the end face of the main body portion 59 of the resin molding member 43. The engaging portion 68 is not a projected surface but a flat surface, which abuts against and engages with two projections 70 disposed next to the mold die 69 during the molding of the resin molding member 43 through the use of the mold die 69, thereby to position and support the sensor assembly 42, in a predetermined position in the mold die 69.

In the magnetic sensor 41 thus constructed, the support within the mold die 69 is provided not only by the engagement between the tip portion 58 of the magnetic core 45 and the recessed portion of the mold die 69, but also by the engagement between the engaging portion 68 which is two flat surfaces formed in the flange 53 of the bobbin 55 and the two projections 70 of the mold die 69, so that the positioning and support against the tilt of the axis and the rotation about the axis of the sensor assembly 42 within the mold die 69 are stable and accurate. While the engaging portion 68 is a flat surface having a circular shape in plan in this example, similar advantageous results can be obtained with other suitable plan shape or even with a non-flat, recessed surface.

EMBODIMENT 3.

Figure 7:
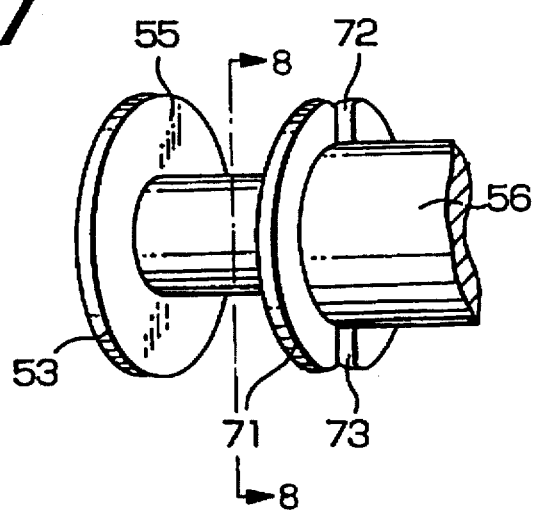
FIG. 7 is a perspective view showing the coil bobbin of the magnetic sensor of the present invention.
Figure 8:
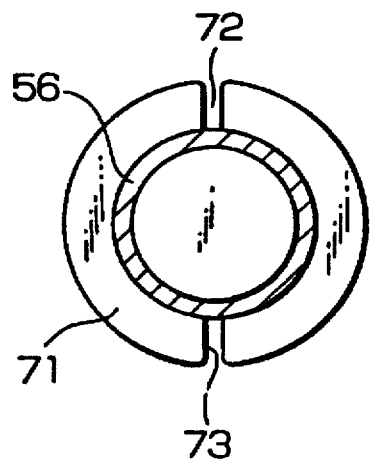
FIG. 8 is a sectional view of a modification of the coil bobbin of the magnetic sensor of the present invention.

FIGS. 7 and 8 illustrate a modified example of the coil bobbin 55 of the magnetic sensor of the present invention. The coil bobbin 55 is provided with lead out ports 72 and 73 in the flange 71 on the sleeve 56 side for allowing the lead out wires 49 and 50 (not shown), to extend therethrough. The lead out ports 72 and 73 are spaced apart from each other by about 180° in the direction of the circumference of the flange 71, whereby the lead out wires 49 and 50 extending through the lead out ports 72 and 73 are prevented from being brought into contact with each other on the sleeve 56. In the magnetic sensor having such the coil bobbin 55, the lead wire 49 arranged on the sleeve 56 is passed through the lead out port 72 of the flange 71 and wound around the bobbin 55 to form the coil 46, and at the end of the turn of the coil 46 the lead out wire is drawn from the lead out port 73 circumferentially separated by 180° onto the sleeve 56 and secured by the tape 48 where it is connected to the connection portion 51 of the terminal 52 by solder or the like.

When such the bobbin 55 is used, the distance between the lead out wires 49 and 50 which comes out of the lead out ports 72 and 73 onto the sleeve 56 is large, so that the contact and short-circuiting between the wires can be prevented.

EMBODIMENT 4.

Figure 9:
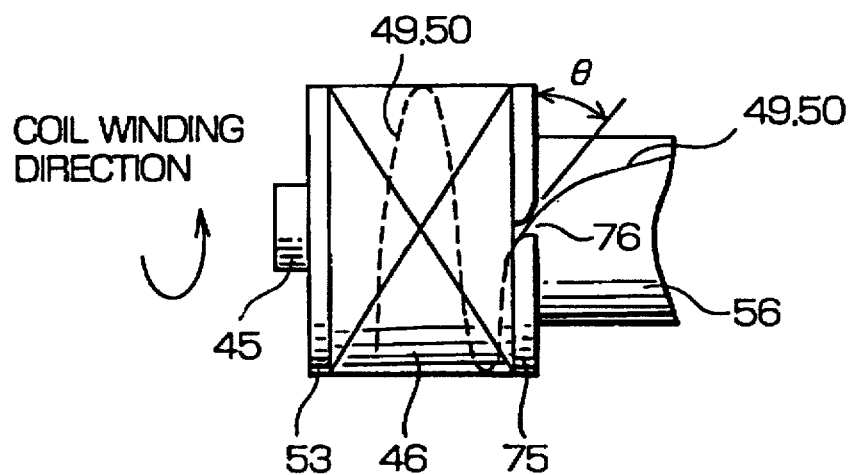
FIG. 9 is a side view showing a modification of the coil bobbin of the magnetic sensor of the present invention.

In the coil bobbin 55 shown in FIG. 9, two lead out ports 76 (only one is shown) formed in the flange 75 on the side of the sleeve 56 are tilted toward the direction of winding of the lead out wires 49 and 50 of the coil 46 wound on the coil bobbin 55 so that the lead out wires 49 and 50 are not folded at an acute angle at the lead out port 76. In other words, the axis of the lead out port 76 is tilted relative to the flange 75 by an acute angle such as of 45° in the direction of extension of the lead out wires 49 and 50 within the coil 46.

In the magnetic sensor having the coil bobbin 55 thus constructed, the contact between the lead out wires 49 and 50 to the lead out port 76 is light, i.e., the contacting pressure is small, and the bent angle of the lead out wires 49 and 50 is small, the breakage of the lead out wires 49 and 50 due to the tension acting on the lead out wires 49 and 50 during the coil winding can be prevented.

EMBODIMENT 5.

Figure 10:
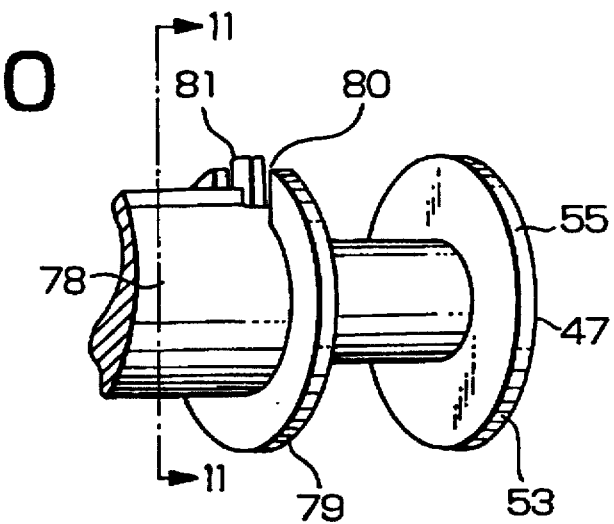
FIG. 10 is a perspective view showing another modification of the coil bobbin of the magnetic sensor of the present invention.
Figure 11:
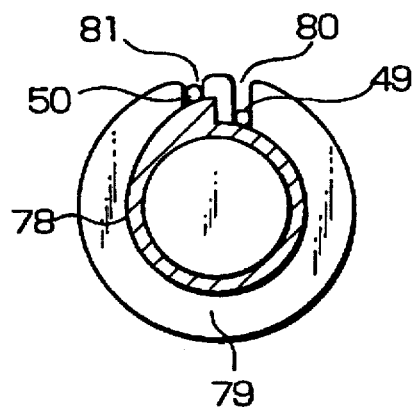
FIG. 11 is a sectional view showing the flange of the coil bobbin shown in FIG. 10.

In the support member 47 shown in FIGS. 10 and 11, the outer circumferential surface of the sleeve 78 varies, and the lead out ports 80 and 81 for the lead out wires 49 and 50 formed in the flange 79 of the coil bobbin 55 extend substantially in parallel to and spaced from each other and radially inward from the outer edge of the flange 79, the inner end of the lead out port 80 being located at the lower portion of the sleeve 78 and relatively deep, and inner end of the lead out port 81 being located at the higher portion of the sleeve 78 and relatively shallow and being at substantially the same radial position as the outer periphery of the coil 46 wound on the coil bobbin 55. The lead out wire 49 extends along the lower portion of the sleeve 78 to be passed over the flange 79 at the deep position of the lead out port 80 to extend into the coil bobbin 55 and wound into the coil, the lead out wire then axially extend immediately from the coil outer periphery to be drawn through the lead out port 81 of the flange 79 to the higher portion of the sleeve 78.

In the support member 47 having the coil bobbin 55 of the above construction, the distance between the two lead out ports 80 and 81 is relatively large both in the circumferential and the radial directions, so that the short-circuiting fault of the lead out wires 49 and 50 on the sleeve 78 can be prevented and, since the lead out wires do not have to be folded in the radial direction, an excessive tension does not act on the lead out wires, enabling to prevent the wire breakage.

EMBODIMENT 6.

Figure 12:
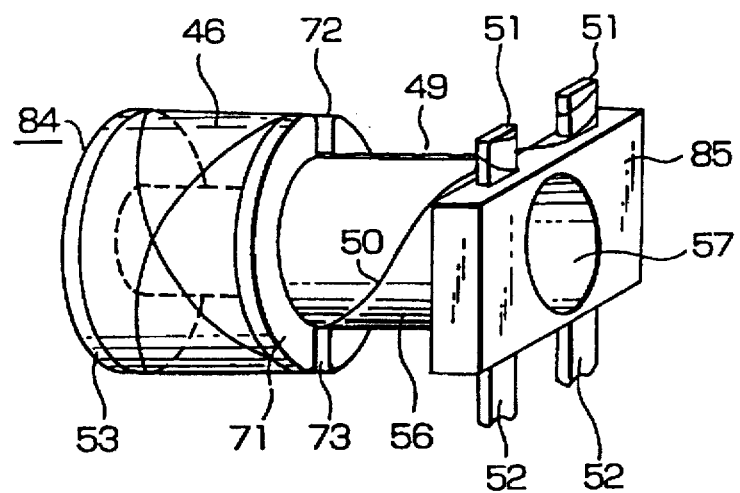
FIG. 12 is a perspective view showing the sensor assembly of the magnetic sensor of the present invention.

FIG. 12 illustrates in a perspective view a still another sensor assembly 42 to be used in the magnetic sensor of the present invention. The support member 84 of this sensor assembly 42 comprises the coil bobbin 55 similar to that shown in FIG. 7. The lead out wires 49 and 50 drawn in the circumferential direction are separated by 180° from each other on the flange 71 and are wound on the sleeve 56. In this figure, the sleeve 56 is provided at its one end with a terminal bed 85 for holding the terminal 52, and the lead out wire 49 is axially wired on the sleeve 56, while the lead out wire 50 is wound on the sleeve 56 from the lead out port 73 to the connection portion 51 by a half around the sleeve 56.

With this arrangement, the distance between the lead out wires 49 and 50 wired on the sleeve 56 and extending from the lead out ports 72 and 73 is large, so that the short circuiting fault between the lead out wires 49 and 50 on the sleeve 56 close to the flange 71 can be prevented. While FIG. 12 illustrates an example in which the two lead out ports 72 and 73 are arranged to be separated at 180° from each other, similar advantageous results can be obtained by circumferentially separating two lead out ports 72 and 73 by an angle of more than 45°. Also, either one or both of two lead out wires 49 and 50 may be wound.

EMBODIMENT 7.

Figure 13:
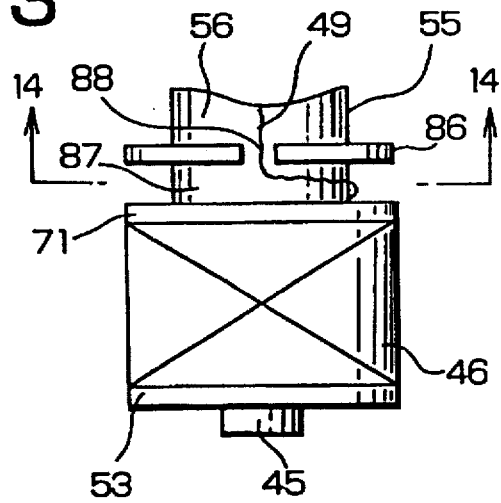
FIG. 13 is a side view showing another modification of the coil bobbin of the magnetic sensor of the present invention.
Figure 14:
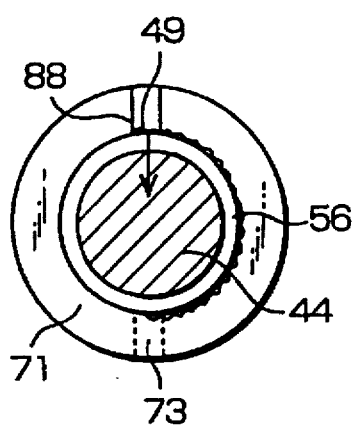
FIG. 14 is a sectional view showing the sate in which the lead out wires are wired on the coil bobbin shown in FIG. 13.

In the sensor assembly 42 of the magnetic sensor of the present invention shown in FIGS. 13 and 14, a flange 86 is disposed outside of the flange 71 of the coil bobbin 55 in a separated parallel relationship to define a circumferential groove 87 therebetween. The flange 86 has substantially the same diameter as that of the flange 71. This flange 86 is provided at a position circumferentially separated from the lead out port (not shown) of the flange 71 with a radially extending slit 88, and the lead out wires 49 or 50 drawn from the flange 71 of the bobbin 55 are wound therearound through the circumferential groove 87 and are lead out upwardly from the slit 88 onto the sleeve 56.

With this arrangement, since the lead out wire 49 or 50 are wound around the circumferential groove 87, the distance between the two lead out wires 49 and 50 can be made large by increasing the distance between two lead out wires 49 and 50 thereby to prevent short circuiting therebetween or to prevent the axial dislocation of the lead out wires 49 or 50, thereby enabling to prevent the wire breakage. While the flange 86 is used in this example, as long as the circumferential groove 87 can be formed, any other suitable structure other than the illustrated separate flange 86 may be employed. Also, the circumferential groove 87 may have two slits 88, so that the respective lead out wires 49 and 50 may be wound around the circumferential groove 87 and drawn from the respective slits.

EMBODIMENT 8.

Figure 15:
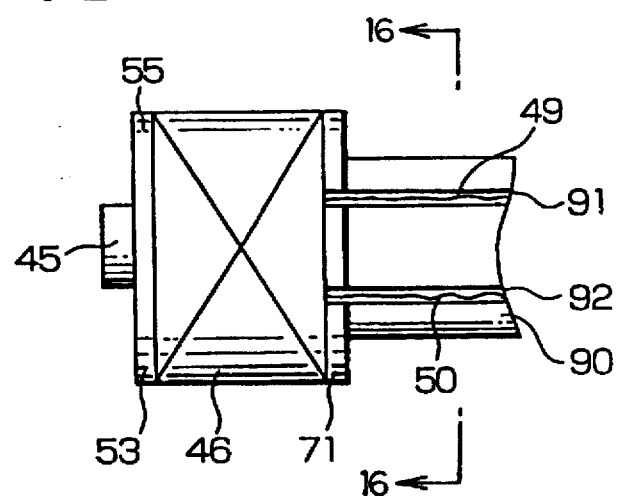
FIG. 15 is a side view showing another modification of the coil bobbin of the magnetic sensor of the present invention.
Figure 16:
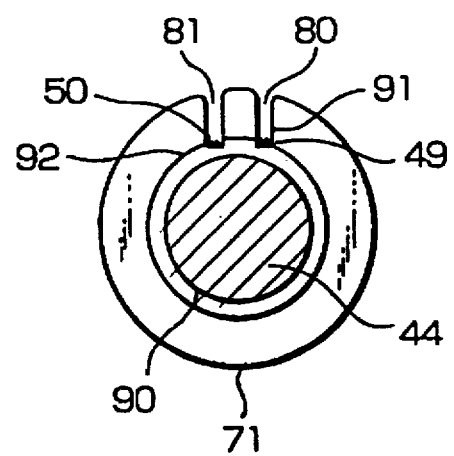
FIG. 16 is a sectional view showing the state in which the lead out wires are wired on the coil bobbin shown in FIG. 15.

In the sensor assembly 42 shown in FIGS. 15 and 16, a sleeve 90 has two mutually spaced apart, parallel axial grooves 91 and 92 and the lead out wires 49 and 50 drawn from the flange 71 of the coil bobbin 55 are wired within the axial grooves 91 and 92 to extend to the unillustrated terminal 52.

In the magnetic sensor employing the sensor assembly 42 of the above construction, the lead out wires 49 and 50 are embedded within the axial grooves 91 and 92 of the sleeve 90, so that the circumferential dislocation of the lead out wires 49 and 50 can be prevented to eliminate the fear of short circuiting.

EMBODIMENT 9.

Figure 17:
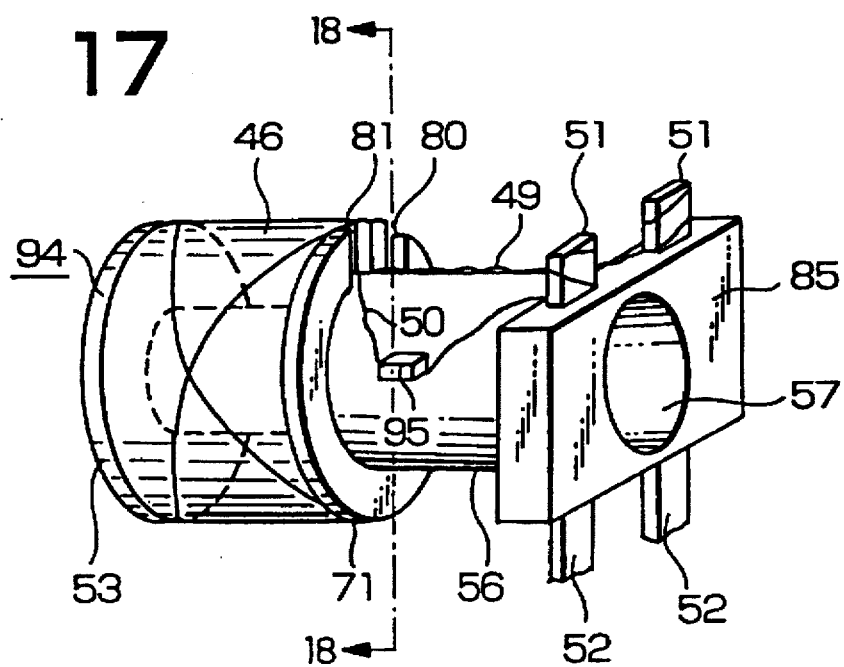
FIG. 17 is a perspective view showing the sensor assembly of the magnetic sensor of the present invention.
Figure 18:
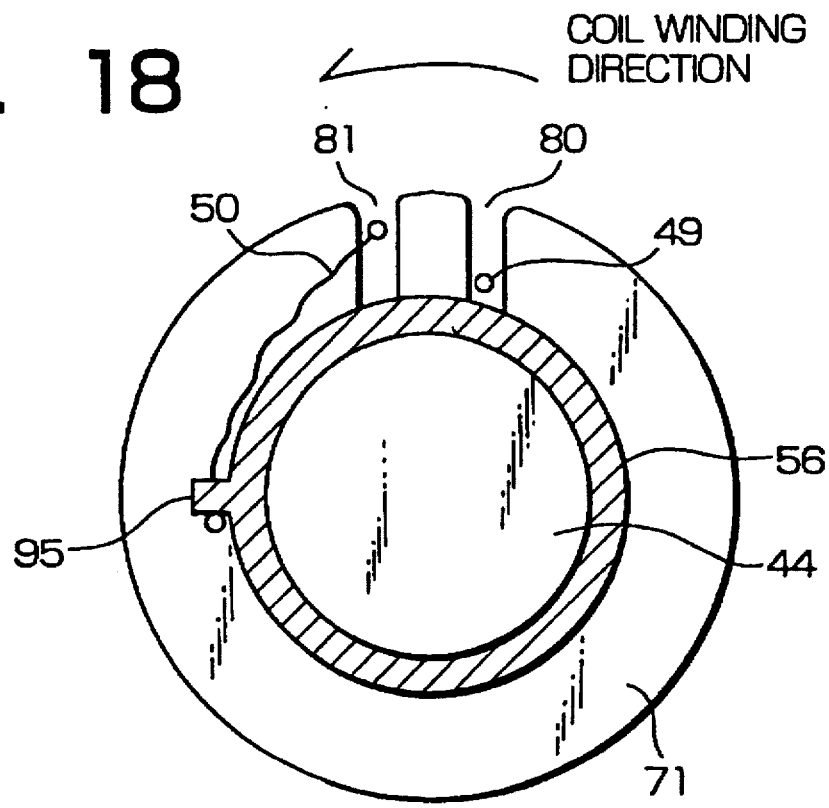
FIG. 18 is a sectional view showing the state in which the wiring is achieved to the coil bobbin and the engaging projection.

FIGS. 17 and 18 are perspective views illustrating another example of the sensor assembly 42 of the magnetic sensor of the present invention. The support member 94 of this sensor assembly 42 is similar in general construction to the support member 84 shown in FIG. 12, and has the coil bobbin 55 similar to that shown in FIG. 10 and the lead out wires 49 and 50 being drawn from the two circumferentially separated lead out ports 80 and 81 of the flange 71 being wound on the sleeve 56. In this figure, the sleeve 56 is provided at its cylindrical circumferential surface and at a position separated by about 90° circumferentially from the lead out port 81 with an engaging projection 95. While the lead out wire 49 is drawn from the inner end of the lead out port 80 to be wired along the sleeve 56 in substantially parallel to the axis of the sleeve 56, the lead out wire 50 is drawn from the outer end of the lead out port 81 to extend along the cylindrical surface of the sleeve 56 toward the engaging projection 95 in a downward spiral manner as seen from the lead out port 81 to be wound around the engaging projection 95 and further extend again spirally to reach to the connection portion 51 of the terminal 52 of the terminal bed 85.

With such the arrangement, the distance between the lead out wires 49 and 50 extending from the lead out ports 80 and 81 and wired on the sleeve 56 is enlarged by the engaging projection 95, so that, even when the distance between the lead out wires 80 and 81 and the terminal connection portion 51 is small, the short circuit fault of the lead out wires 49 and 50 on the sleeve 56 can be prevented.

EMBODIMENT 10.

Figure 19:
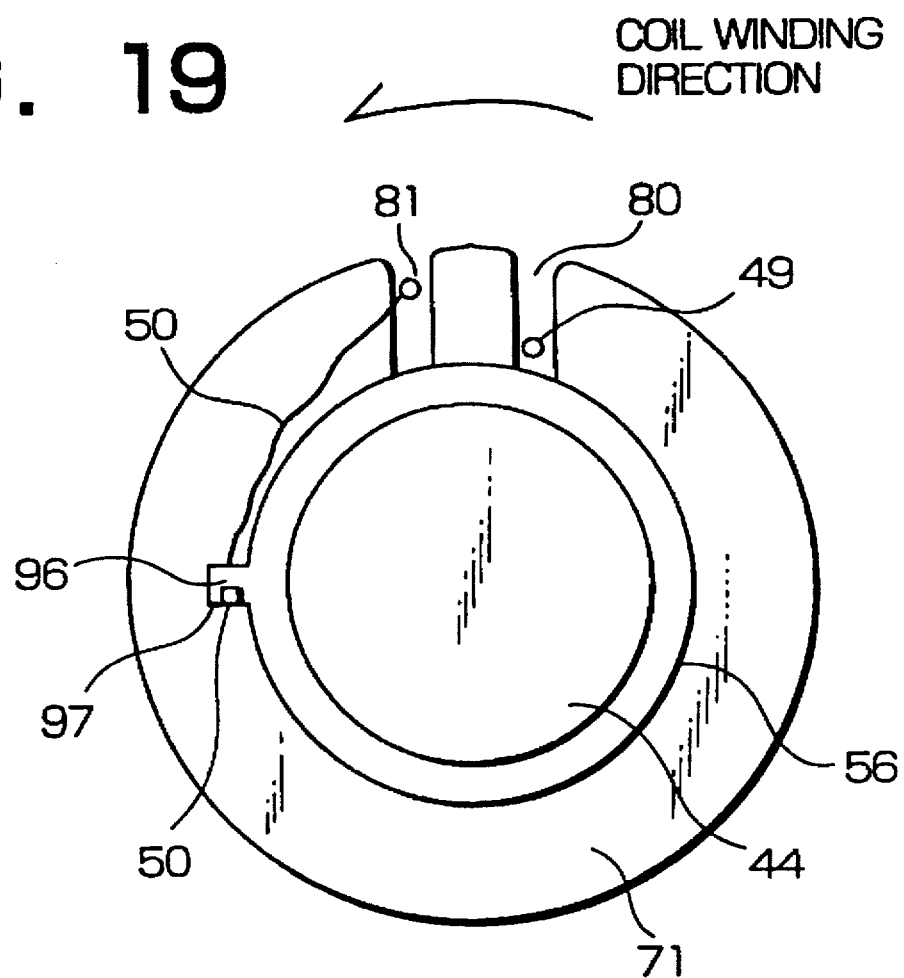
FIG. 19 is a sectional view showing a modified example of the coil bobbin and the engaging projection.

In the embodiment shown in FIG. 19, the engaging projection 96 on the sleeve 56 has an engaging groove 97 in the lower face thereof as seen from the lead out port 81 and the lead out wire 49 is passed into the engaging groove 97 and wound around the engaging projection 96.

In this embodiment, the short circuiting fault due to the contact between the lead out wires 49 and 50 can be prevented and the dislocation or the breakage of the lead out wire 49 can be prevented because the lead out wire 49 inserted into the engaging groove 97 cannot easily be dislodged from the engaging projection 96.

EMBODIMENT 11.

Figure 20:
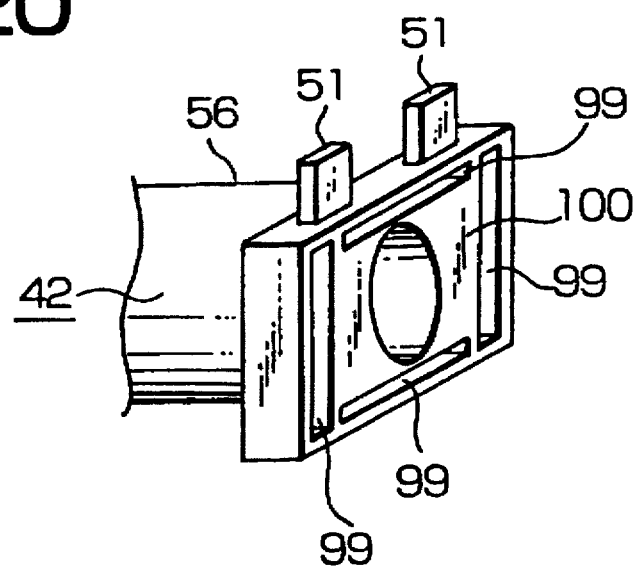
FIG. 20 is a perspective view showing the terminal portion of the support member of the sensor assembly of the magnetic sensor of the present invention.
Figure 21:
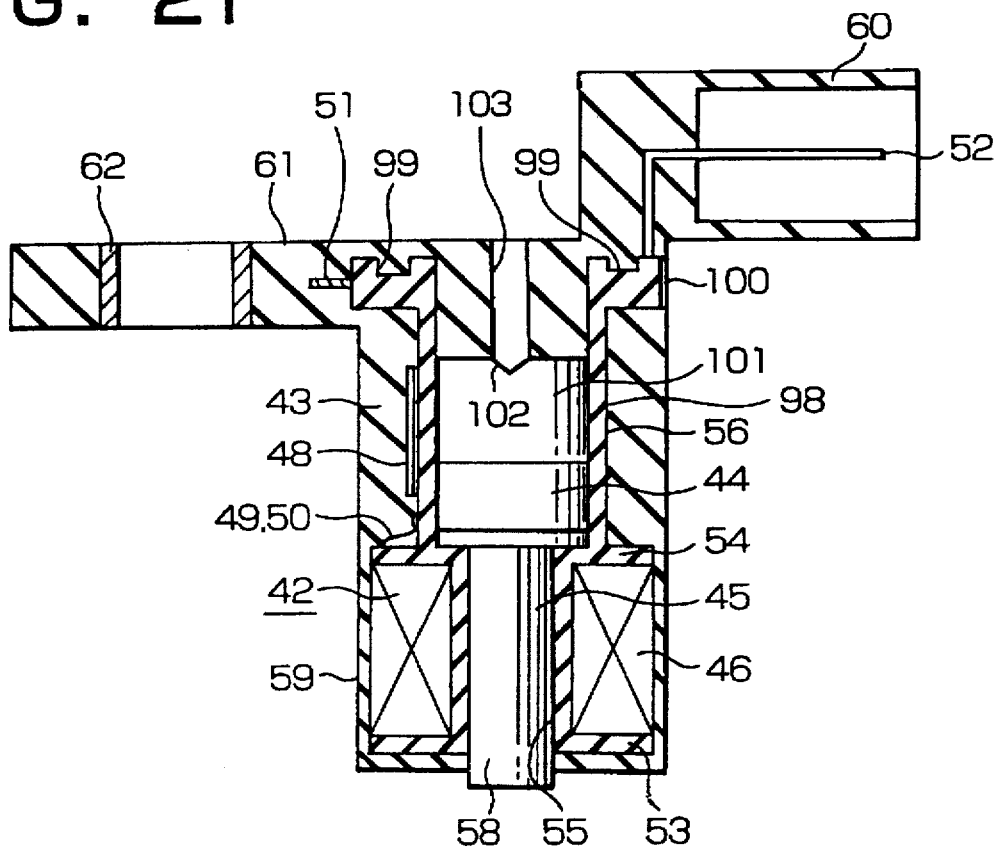
FIG. 21 is a sectional view illustrating an embodiment of the magnetic sensor of the present invention employing the support member shown in FIG. 20.

In the sensor assembly 42 of the magnetic sensor shown in FIGS. 20 and 21, the support member 98 which supports the magnet 44, the magnetic core 45, the coil 46 and the like as an assembly, comprises the coil bobbin 55 for receiving therein the magnetic core 45, the sleeve 56 connected at one end to the coil bobbin 55 for accommodating the sleeve 56, a terminal bed 100 integrally disposed to the other end of the sleeve 56 and having an engaging recessed portion 99, and the terminal 52 electrically connected to the terminal bed 100 and connected to the lead out wires 49 and 50 from the coil 46 at the connection portion 51. In the upper end surface of the spacer 101 which holds the magnet 44 within the sleeve 56, a positioning recess 102 is formed.

The engaging recess 99 of the terminal bed 100 is, in the illustrated example, a relatively elongated groove forming along each side of the rectangular terminal bed 100 to surround the bore of the sleeve 56, the resin molding member 43 entering into this engaging recess 99 when the sensor assembly 42 is being molded and the area of the contacting interface between the resin molding member 43 and the terminal bed 100 becomes large to improve the intimate contact therebetween.

Also, in order to accurately and stably support the sensor assembly 42 within the mold die during the resin molding, the tip of the core pin (not shown) of the mold die is inserted into and supported by the positioning recess 102 of the spacer 101, thereby to establish the two-point support together with the support by the engagement of the tip 58 of the magnetic core 45 into the recess of the mold die. In this case, a through hole 103 which is a hole left after the removal of the core pin is formed in the completed resin molding member 43, causing the positioning recess 102 of the spacer 101 to be exposed therethrough. Even if rain water or any electrically conductive fluid enters into this through hole 103, through the use of the terminal bed having the engaging recess 99 as shown in FIGS. 20 and 21, the interface area between the resin molding member 43 and the terminal bed 100 is wide and the distance to the connection portion 51 of the terminal 52 is large, enabling the short circuiting due to the moisture can be prevented.

EMBODIMENT 12.

Figure 22:
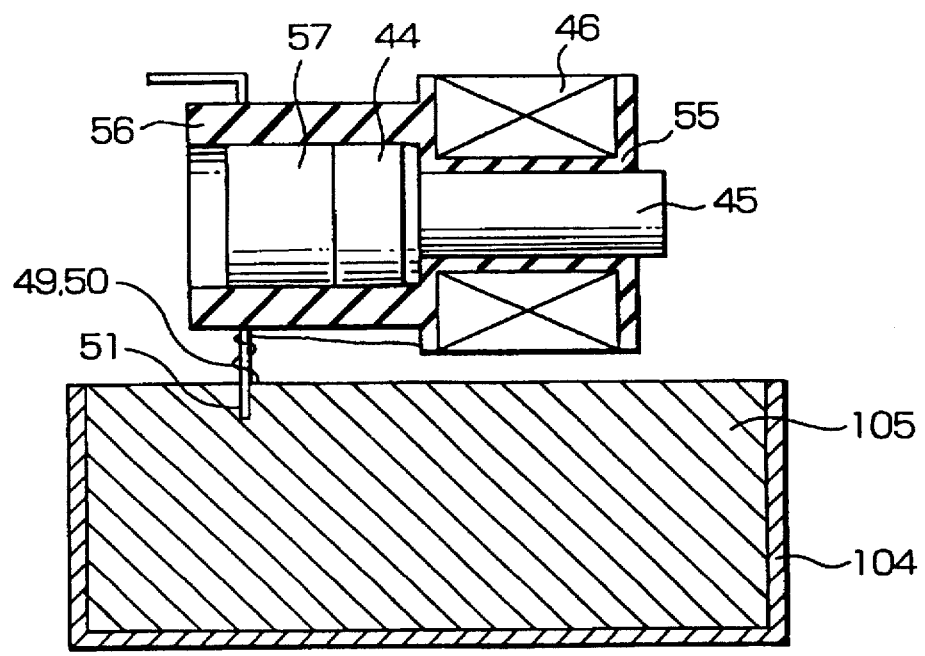
FIG. 22 is a schematic view showing the soldering operation at the terminal portion of the sensor assembly of the magnetic sensor of the present invention.

In the sensor assembly 42 shown in FIG. 22, the connection portion 51 of the terminal 52 disposed at the other end of the sleeve 56 and connected to the coil 46 projects radially outwardly from the outer diameter of the coil bobbin 55. The sensor assembly shown in FIGS. 20 and 21, which is different in that the terminal 52 is disposed on the terminal bed 100, is similar to that shown in FIG. 22 in that the connection portion 51 of the terminal 52 is positioned radially outside of the outer diameter of the coil bobbin 55, and as apparent from FIG. 21, the connection portion 51 projecting in the radial direction is embedded within the thickness of the mounting bracket 61 of the resin molding member 43 so that the diameter of the main body portion of the resin molding member 43 does not become large.

With this arrangement, even when the axis of the sensor assembly 42 is placed horizontal with the connection portion 51 oriented downward and the connection portion 51 is dipped into the solder bath 105 within the solder tank 104 as shown in FIG. 22, the other portion such as the coil 46, the coil bobbin 55 and the like of the sensor assembly 42 does not come into contact with the high temperature solder bath 105, so that the soldering can be automated with the solder bath without relying upon the manual operation, significantly improving the operability.

EMBODIMENT 13.

Figure 23:
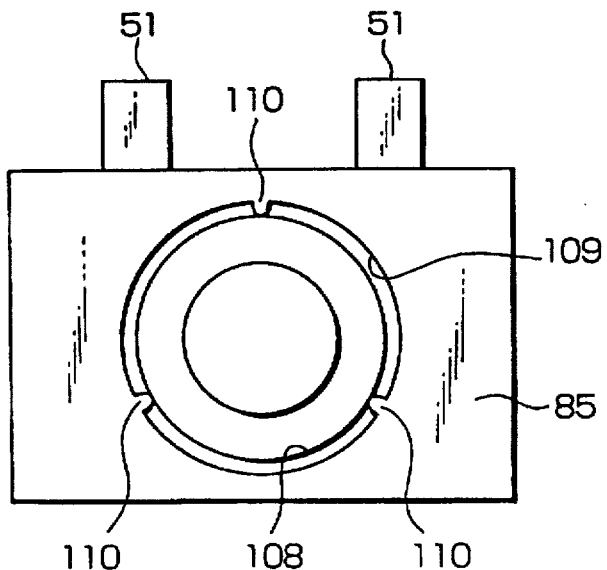
FIG. 23 is a plan view illustrating the relationship between the spacer and the sleeve of the support member of the magnetic sensor of the present invention.
Figure 24:
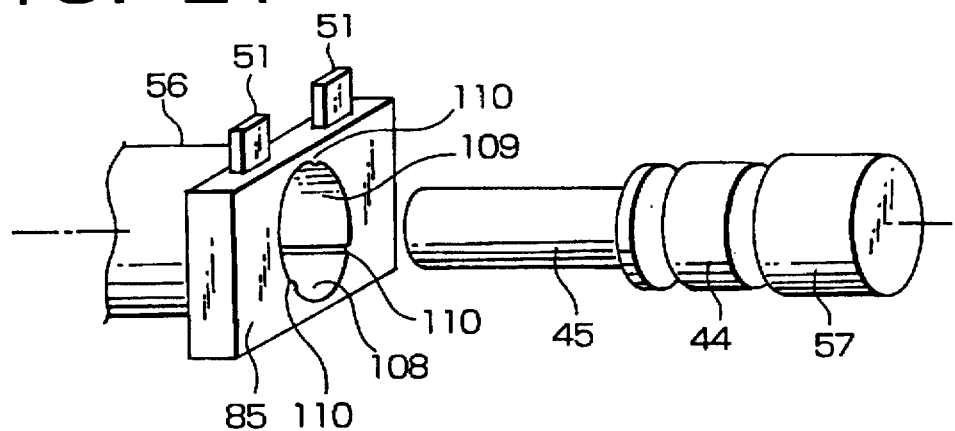
FIG. 24 is an exploded perspective view of the sensor assembly shown in FIG. 23.
Figure 25:
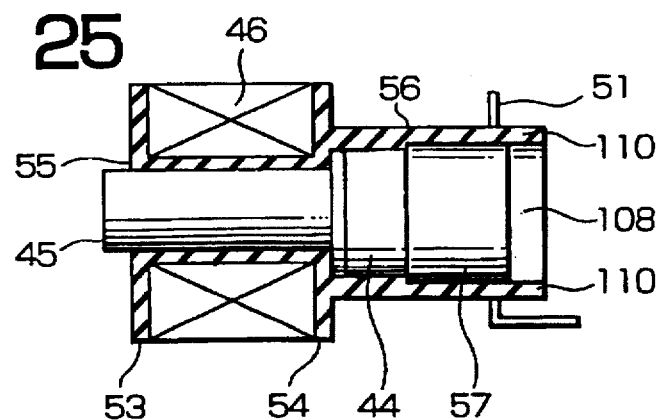
FIG. 25 is a sectional view of the sensor assembly shown in FIG. 23.
Figure 26:
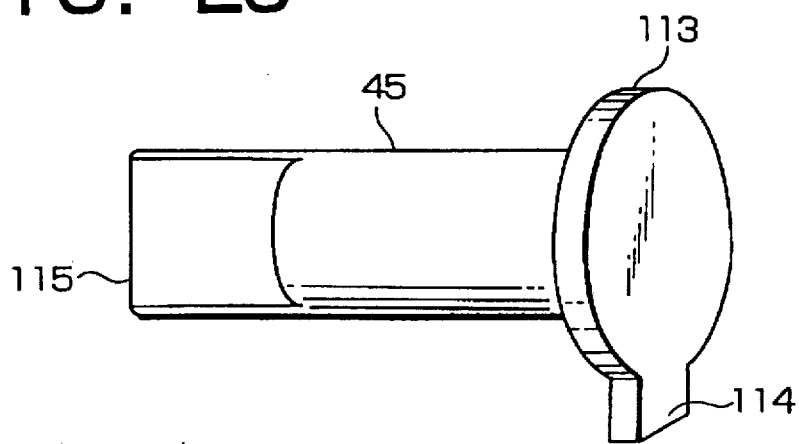
FIG. 26 is a perspective view showing a modification of the magnetic core of the magnetic sensor of the present invention.
Figure 27:
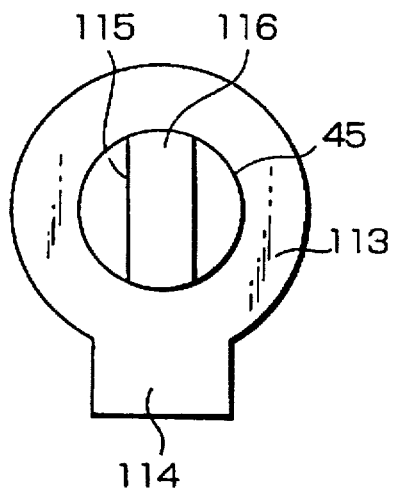
FIG. 27 is a bottom view of the magnetic core shown in FIG. 26.
Figure 28:
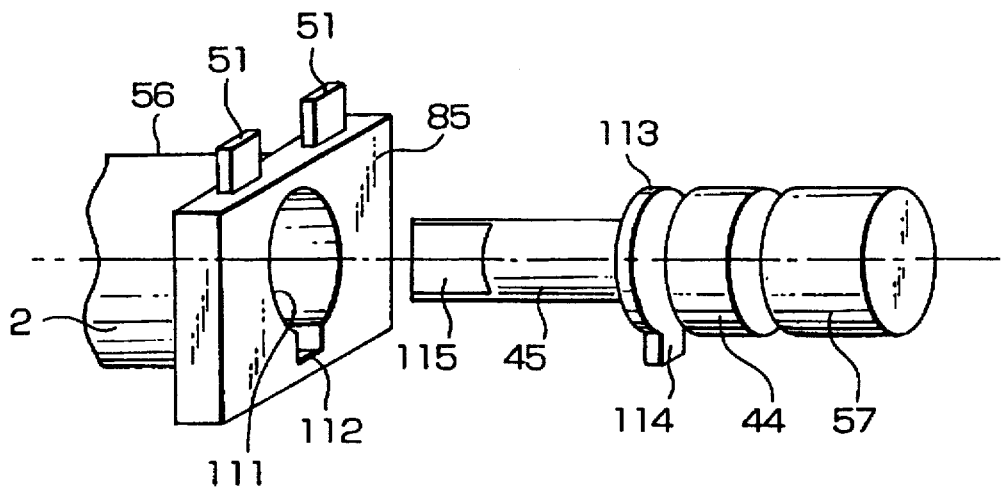
FIG. 28 is a perspective view showing the relationship between the magnetic core shown in FIG. 26 and the sleeve.
Figure 29:
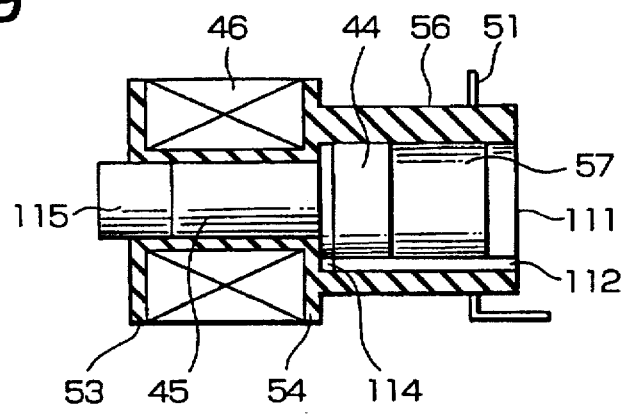
FIG. 29 is a sectional view showing the relationship between the magnetic core shown in FIG. 26 and the sleeve.

FIGS. 23 to 25 illustrate the sensor assembly 42 of the present invention. In this sensor assembly 42, the inner peripheral surface 109 of the through hole 108 of the sleeve 56 of the support member 47 is provided with three axially elongated projections 110 projecting from the inner peripheral surface 109. These projections 110 are positioned radially inward of the inner peripheral surface 109 and the diameter of a circle contacting the projections 110 is smaller than that of the circle of the inner peripheral surface 109, so that this portion may be referred to as a smaller-diameter portion of the inner peripheral surface 109. The outer diameter of the spacer 57 is larger than the circle contacting the projections 110 but smaller than the through hole 108, and the length of the projections 110 is that corresponds to the position to which the spacer 57 of the sleeve 56 enters as shown in FIG. 25, the magnet 44 being supported by the inner peripheral surface of the through hole 108.

In assembling the sensor assembly 42, the magnetic core 45 is first inserted into the through hole 108 of the sleeve 56 until its tip portion project from the coil bobbin 55 and the magnet 44 is inserted until it abuts against the magnetic core 45 and finally the spacer 57 is inserted into the through hole 108 of the sleeve 56. At this time, since the outer diameter of the spacer 57 is larger than the circle contacting the projections 110 and smaller than the through hole 108, by inserting the spacer 57 into the through hole 108 under pressure, the spacer 57 is pressure-fitted within the sleeve 56 and held therein. In the illustrated example, the projections are three ridges, but the configuration and the number of the projections may be suitably selected as long as the spacer 57 can be pressure-fit within the through hole 108 of the sleeve 56. The projections 110 may also be provided on the spacer.

In the sensor assembly of such the construction, the magnetic core 45 and the magnet 44 can be held in a predetermined position by pressure-fitting the spacer 57 into the through hole 108 of the sleeve 56, so that the assembling is simple and easy and the automation can be easily achieved.

EMBODIMENT 14.

In the sensor assembly 42 of the magnetic sensor shown in FIGS. 26 to 29, a through hole 111 of the sleeve 56 is provided with a key way 112 extending along its entire length, a flange 113 of the magnetic core 45 has formed thereon a key 114 fitting to the key way 112, and the tip 115 of the magnetic core 45 is cut at both sides in parallel to provide a elongated circular or oval end face 116. By making the end face 116 of the magnetic core 45 elongated with its longitudinal axis perpendicular to the direction of movement of the object to be detected (such as the detection piece 25 of the rotary disc plate 26 shown in FIG. 40), the leading edge of the output signal can be made sharp so that the detection of the position of the object to be detected may be precise. Therefore, the orientation of the longitudinal axis of the elongated circular end face 116 or the rotational position about the central axis of the magnetic core 45 is important.

In assembly, when the magnetic core 45 is inserted into the sleeve 56 with its key 114 in engagement with the key way 112, position of the magnetic core 45 about its central axis is determined and, therefore, the longitudinal axis of the elongated circular end face 116 of the tip 115 of the magnetic core 45 is determined, so that by precisely mounting the magnetic sensor, the magnetic core 45 can be properly attached with the orientation of its end face 116 in the predetermined correct orientation. In this sense, the key way 112 of the sleeve 56 and the key 114 of the magnetic core 45 may be referred to as positioning means disposed between the magnetic core 45 and the sleeve 56 for mutual engagement for positioning the magnetic core 45 relative to the sleeve 56. A similar advantageous result can be obtained by forming the key way in the magnetic core and providing the key to the sleeve.

EMBODIMENT 15.

Figure 30:
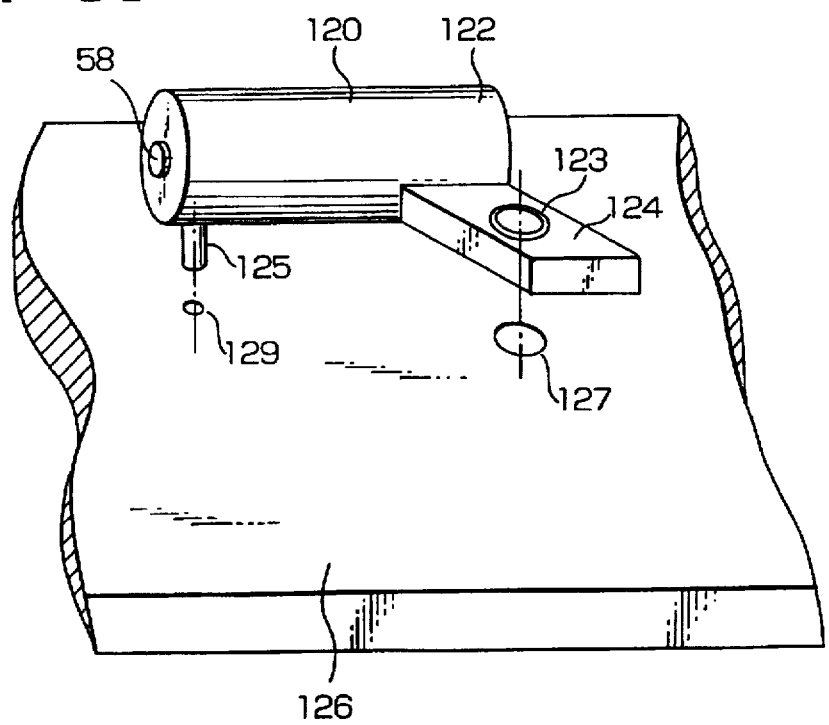
FIG. 30 is a perspective view showing a modification of the magnetic sensor of the present invention.
Figure 31:
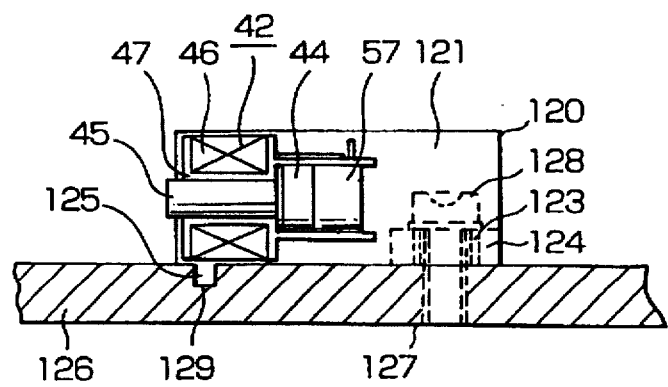
FIG. 31 is a sectional view showing the manner in which the magnetic sensor shown in FIG. 30 is mounted.

The magnetic sensor 120 shown in FIGS. 30 and 31 comprises the sensor assembly 42 and the resin molding member 121, the sensor assembly 42 comprising the magnet 44, the magnetic core 45, the coil 46, the spacer 57 and the support member 47 for holding these components in a predetermined positional relationship to compose an assembly. The resin molding member 121 surrounds the sensor assembly 42 while allowing the tip 58 of the magnetic core 45 to project therefrom to define a housing for the magnetic sensor 120. The resin modeling member 121 of the magnetic sensor 120 comprises a cylindrical main body portion 122 surrounding the sensor assembly 42 and accommodating the unillustrated connector, the mounting bracket 124 extending radially outward from the main body portion 122 and having a mounting hole 123 extending perpendicular to the axis of the magnetic sensor 120, and a positioning pin 125 or positioning means disposed from the cylindrical surface of the resin molding member 121 in the vicinity of the tip 58 of the magnetic core 45 projected from the resin molding member 121. The positioning pin 125 extends perpendicularly to the axis of the magnet sensor 120 as is the mounting holer 123 of the mounting bracket 124.

The magnetic core 120 thus constructed is mounted and laid, as illustrated, relative to the mounting bed 126 which is the support structure with its axis parallel thereto. That is, the mounting bracket 124 is placed in parallel to the mounting bed 126 with its mounting holes 123 in alignment with the thread hole 127 of the mounting bed 126 and can be firmly secured by the screw 128 as shown in FIG. 31. The positioning pin 125 also fits into the positioning hole 129 of the mounting bed 126 to precisely position the tip 58 of the magnetic core 45 of the magnetic sensor 120 relative to the mounting bed 126. It is not necessary to place the main body portion into the opening of the mounting bed as in the related magnetic sensor shown in FIGS. 40 to 42

In such the magnetic sensor 120, since the positioning pin 125 is disposed very close the tip 58 of the magnetic core 45, the positioning accuracy can be made very high. This is a very useful advantage because the magnetic sensor in general is required to have a precisely constant distance between the magnetic core and the signal detecting plate for the reduction of the fluctuation of the output signal. Also, the main body portion of the magnetic sensor is not required to be passed through the mounting bed and it can be arranged in parallel to the mounting bed, so that the degree of freedom of the arrangement of the magnetic sensor is high.

EMBODIMENT 16.

Figure 32:
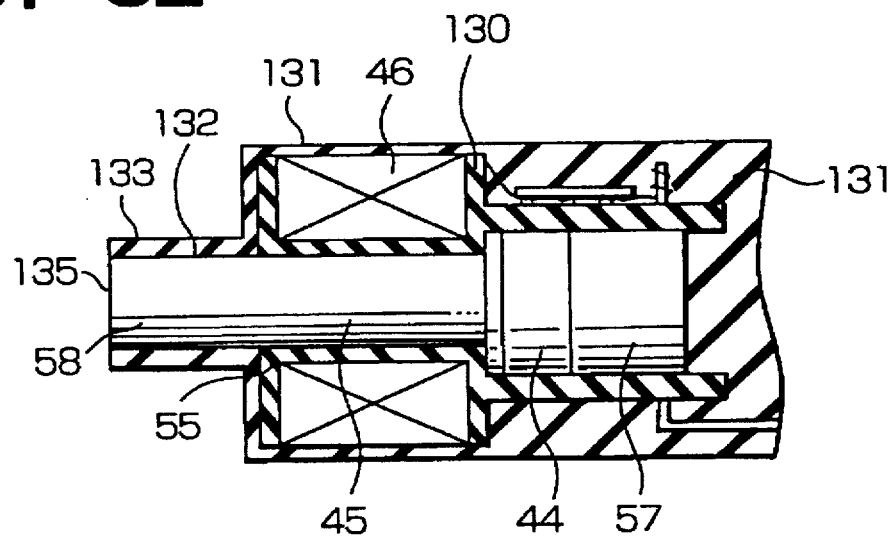
FIG. 32 is a sectional view showing a modified example of the magnetic sensor of the present invention.
Figure 33:
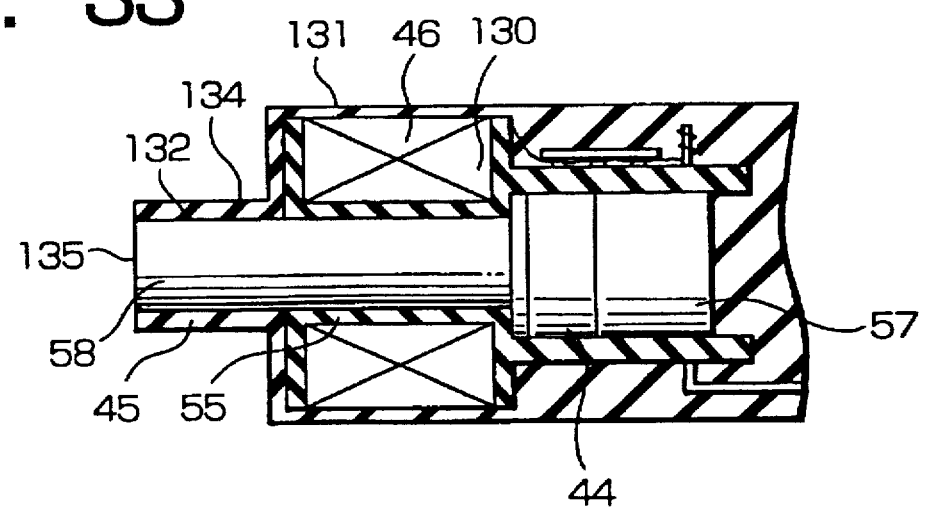
FIG. 33 is a sectional view showing a modified example of the magnetic sensor of the present invention.
Figure 34:
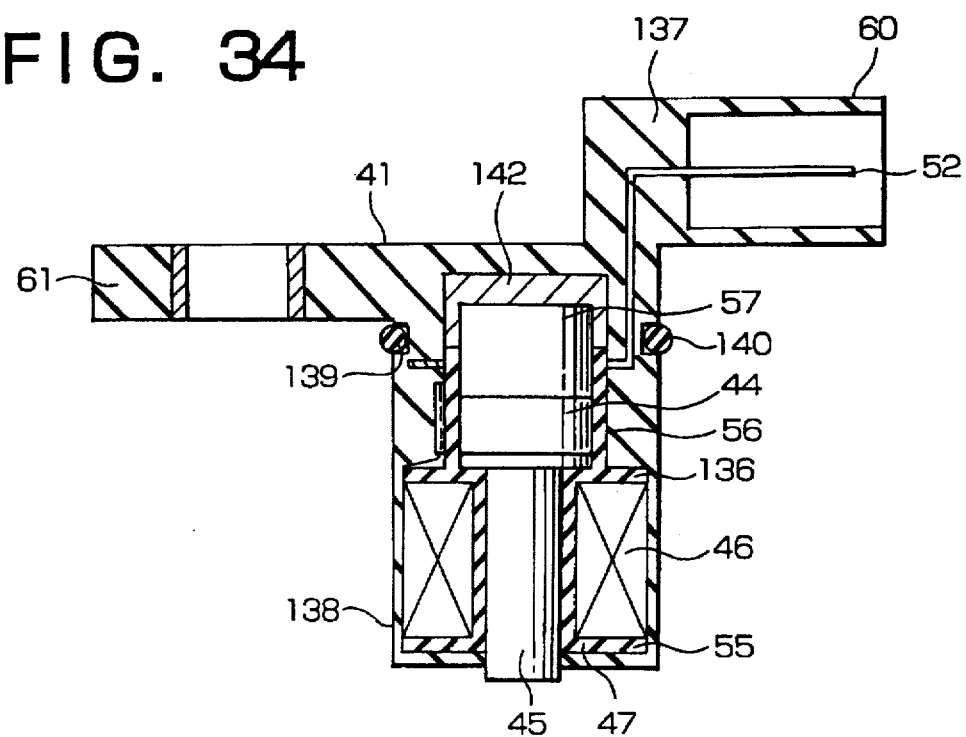
FIG. 34 is a sectional view of an embodiment the magnetic sensor of the present invention in which the sensor assembly having a cap is used.

In FIGS. 32 and 33, still another embodiment of the magnetic sensor of the present invention is illustrated in which the magnetic sensor comprises a sensor assembly 130 having the magnetic core 45, a resin molding member 131 surrounding the sensor assembly 130 with the tip 58 of the magnetic core 45 projected therefrom and defining a housing of the magnetic sensor and covers 133 and 134 surrounding at least part of a side face 132 of the tip 58 projecting from the resin molding member 131 of the magnetic core 45.

In the example shown in FIG. 32, the cover 133 surrounding the side face 132 of the tip 58 of the magnetic core 45 is the cover 133 which integrally extends from the resin molding member 131 along the tip 58 of the magnetic core 45 over its entire length. In the example shown in FIG. 33, the side surface 132 of the tip 58 of the core 45 projecting from the resin molding member 131 is covered with the cover 134 which integrally continues from the resin molding member 131 and extends along the tip 58 of the magnetic core 45 over its entire length. In either example, the end surface 135 of the tip 58 is not coated.

In the magnetic sensor thus constructed, since the side surface of the tip 58 of the magnetic core 45 is coated with the resin cover 133 or 134, the magnetic attraction of any magnetic foreign matters onto the side surface of the magnetic core 45 can be prevented and the corrosion resistance can be improved. While similar advantageous results may be obtained with a cover which covers only one portion of the side surface 132 of the tip 58 of the magnetic core 45, it is preferable to coat the entire side surface 132. Since the end surface 135 of the magnetic core 45 is not coated, the magnetic detection is not obstructed.

EMBODIMENT 17.

In the embodiment shown in FIGS. 34 to 37, the magnetic sensor comprises the sensor assembly 136 and the resin molding member 137 disposed to surround the sensor assembly 136 and defining the housing, and the cylindrical main body portion 138 of the resin molding member 137 has formed therein a circumferential groove 139, in which an O-ring 140 is fitted. The sensor assembly 136 comprises the magnet 44 generating the magnetic flux, the magnetic core 45 defining the magnetic circuit, the coil 46 wound around the magnetic core 45 for detecting the fluctuation in the magnetic flux flowing through the magnetic core 45, and a support member 47 for supporting the assembly composed of the magnet 44, the magnetic core 45 and the coil 46.

The support member 47 comprises the coil bobbin 55 for accommodating the magnetic core 45 and on which the coil 46 is to be wound, the sleeve 56 connected at one end to the coil bobbin 55 for accommodating the magnetic core 45 and the magnet 44, the spacer 57 for holding the magnetic core 45 and the magnet 44 within the sleeve 56, the terminal 52 disposed at the other end of the sleeve 56 and connected to the coil 46 and a cap 142 for holding the spacer 57 within the sleeve 56. The cap 142 may be made of a resin material identical to or similar to that of the resin molding member and preferably of a material having the same thermal expansion coefficient, examples of such material being PBT, PP, nylon and epoxy resin.

Figure 36:
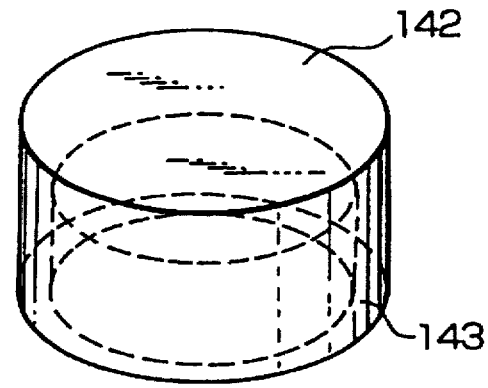
FIG. 36 is a perspective view showing the cap of the magnetic sensor shown in FIG. 34.
Figure 37:
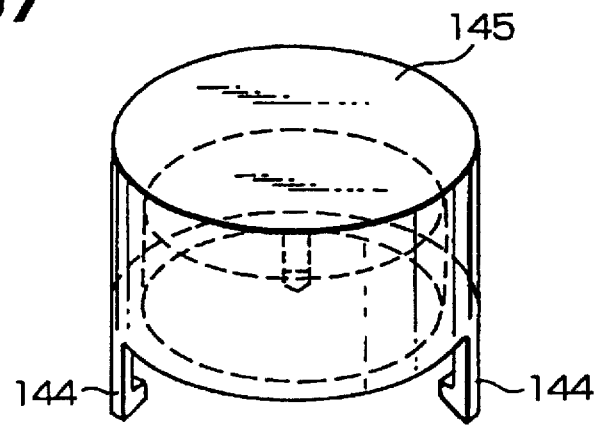
FIG. 37 is a perspective view showing a modification of the cap of the magnetic sensor of the present invention.

The cap 142 is of the configuration as shown in FIG. 36 for example and is fitted to the portion of the spacer 57 that comes out of the sleeve 56 where it is secured at its edge portion 143 by the bonding agent to the edge of the sleeve 56. As shown in FIG. 37, the cap may be a cap 145 which has engaging tabs 144, where the engaging tabs 144 of the cap 145 are elastically engaged with the recesses (not shown) formed in the outer periphery of the sleeve 56.

Figure 35:
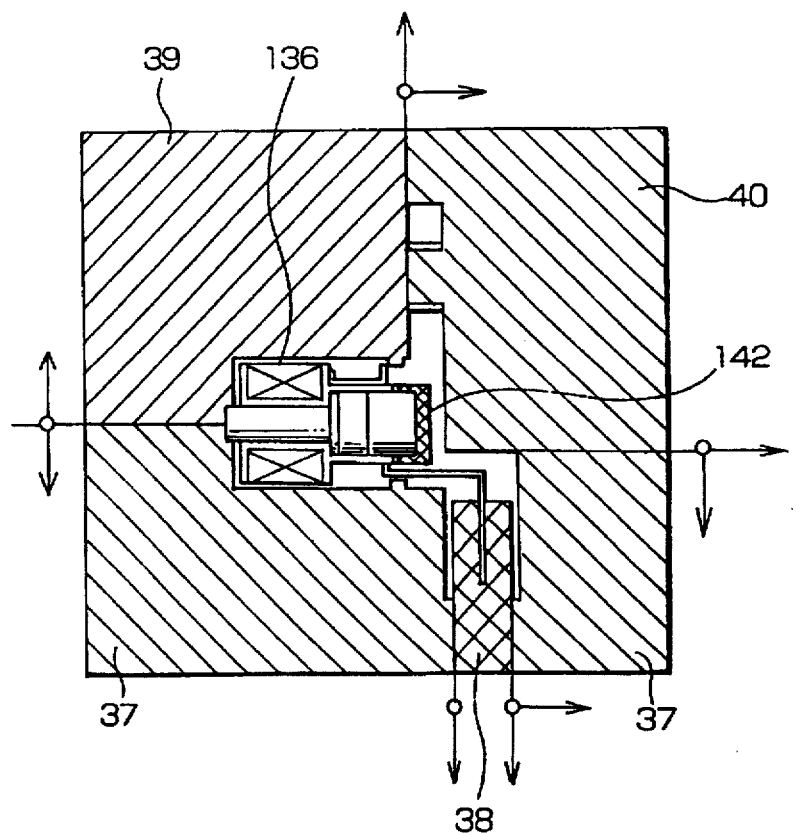
FIG. 35 is a sectional view showing the mold die for the magnetic sensor shown in FIG. 34.

The cap 142 or 145 functions to prevent the spacer 57 comes out of the sleeve 56 when the sensor assembly 136 is horizontally positioned as shown in FIG. 35, where, in order to mold the magnetic sensor 41 with the circumferential groove 139 for the O-ring 140 thereon, the sensor assembly 136 is placed within the mold dies 37 to 40 with its axis horizontally oriented and with its terminal downwardly directed so that the circumferential groove 139 does not constitute an under-cut (the formation of a projected portion of the mold die which impedes the removal of the mold product) as previously discussed. The fear of the spacer 57 coming out is present because the magnet 44 is not yet magnetized at this stage. Thus, with this sensor assembly, the magnetic core, the magnet and the spacer can be securely held within the sleeve even before the resin molding, so that the manufacturing step can be automated. Also, since the cap 142 can be attached with a slight amount of bonding agent, therein no fear that an excessive bonding agent enters between the spacer 57 and the magnet 44 to generate a magnetic resistance. When the cap 145 having the elastic engaging tabs 144 shown in FIG. 37 is used, no bonding agent at all is necessary, allowing the cap 145 to be secured by a single action, improving the manufacturing efficiency. The number and the shape of the engaging tabs 144 may be change at will as long as they can secure the cap 145 to the sleeve 56.

EMBODIMENT 18.

Figure 38:
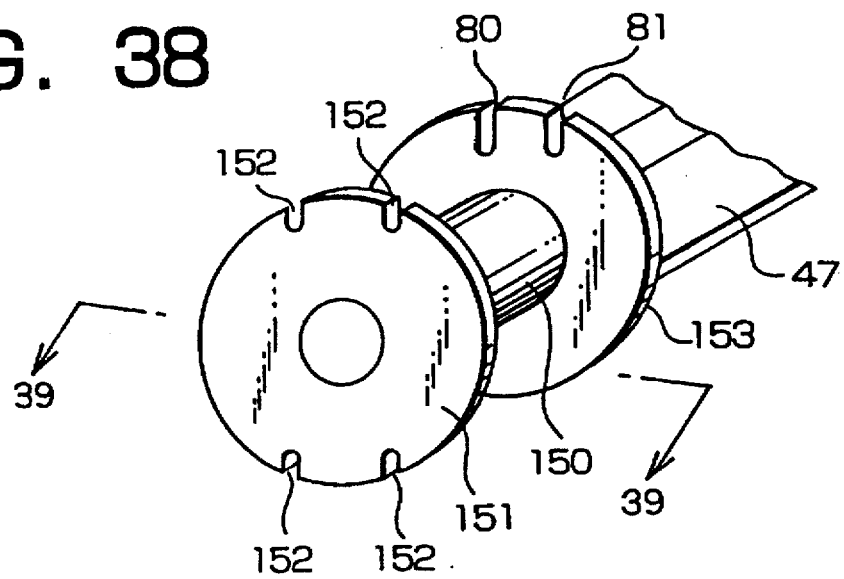
FIG. 38 is a perspective view showing the modification of the coil bobbin of the magnetic sensor of the present invention.
Figure 39:
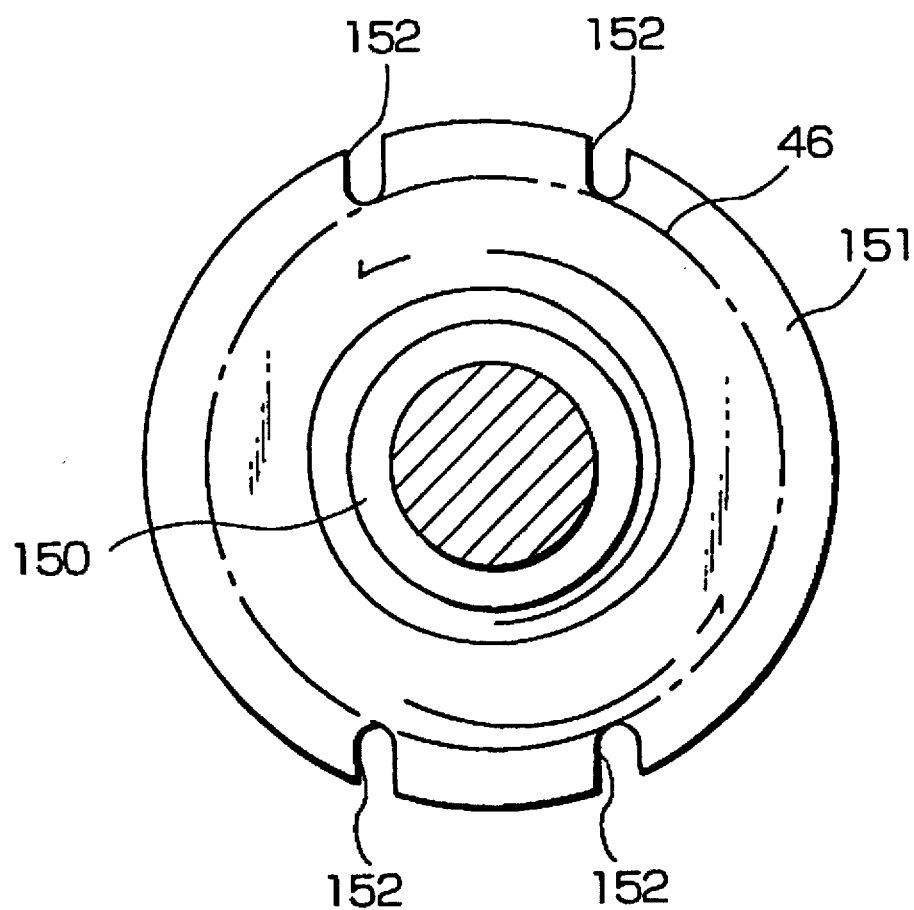
FIG. 39 is a sectional view of the coil bobbin shown in FIG. 38.

In the embodiment of the magnetic sensor of the present invention as shown in FIGS. 38 and 39, a plurality of notches 152 are formed in an outer edge portion of the flange 151 of the coil bobbin 150 of the support member 47 and outside of the portion in which the coil 46 is wound. These notches 152 are resin passages for allowing the molten resin to flow therethrough during the resin molding with the sensor assembly contained within the molding die.

The shape and the number of the notches 152 may be changed in many way but must not have adverse affects on the winding operation of the coil 46, the wound coil 46 and on the flow of the injected resin. For example, a single notch 152 may be used. The notch 152 may be provided on only the other of the flange 153 or on both of the flanges 151 and 153. Also, the notch 152 does not have to be in the shape of a notch, but may be a reduced-diameter portion extending in part or in entirety of the circumference of the flange 151 and having the same diameter as that of the wound coil 46.

In this magnetic sensor, the flow of the molten resin during the resin molding is not prevented by the flange 151 or 153 of the coil bobbin 150, improving the flow of the molten resin within the mold die, allowing the magnetic sensor to be compact and the manufacturing yield to be improved.

As has been described, the magnetic sensor of the present invention of embodiment 1 comprises a sensor assembly, and a resin molding member surrounding the sensor assembly and defining a housing, the sensor assembly comprising a magnet for generating a magnetic flux, a magnetic core for defining a magnetic circuit, a coil wound around the magnetic core for detecting the change in the magnetic flux flowing through the magnetic core and a support member including a coil bobbin for supporting an assembly of the magnet, the magnetic core and the coil, and the support member comprising an engaging portion which is a surface exposed from the resin molding member for positioning the sensor assembly in a predetermined position during the molding of the resin molding member, so that the sensor assembly can be supported within the resin mold die by the engaging portion between the magnetic core and the coil bobbin or only by the engaging portion of the coil bobbin, so that the stable positioning and support is provided.

In the magnetic sensor of embodiment 1, the engaging portion includes a projection disposed to the coil bobbin, so that the sensor assembly can be stably positioned and supported and the rotation of the sensor assembly about its central axis can be prevented.

In the magnetic sensor of embodiment 3, the coil bobbin comprises a flange including lead out ports for allowing lead out wires to extend therethrough, and the lead out ports are circumferentially spaced apart from each other on the flange to prevent a contact of the lead out wires passing therethrough, so that the sensor assembly can be stably positioned and supported and the rotation of the sensor assembly about its central axis can be prevented and further the danger of contacting and short-circuiting between the lead out wires on the support member can be eliminated.

The magnetic sensor of embodiment 3 comprises a sensor assembly, and a resin molding member surrounding the sensor assembly and defining a housing, the sensor assembly comprising a magnet for generating a magnetic flux, a magnetic core for defining a magnetic circuit, a coil wound around the magnetic core for detecting the change in the magnetic flux flowing through the magnetic core and a support member including a coil bobbin for supporting an assembly of the magnet, the magnetic core and the coil, and the coil bobbin comprising a flange including lead out ports for allowing lead out wires to extend therethrough, and the lead out ports are circumferentially spaced apart from each other on the flange to prevent a contact of the lead out wires passing therethrough, so that the danger of contacting and short-circuiting between the lead out wires on the support member can be eliminated.

In the magnetic sensor of embodiment 4, the axes of the lead out ports are inclined relative to the flange so that it is at an acute angle relative to the direction of lead out wire winding direction on the coil bobbin, so that the lead out wires are not folded at the flange of the coil bobbin eliminating the cause of wire breaking.

The magnetic sensor of embodiment 3 comprises a sensor assembly, and a resin molding member surrounding the sensor assembly and defining a housing, the sensor assembly comprising a magnet for generating a magnetic flux, a magnetic core for defining a magnetic circuit, a coil wound around the magnetic core for detecting the change in the magnetic flux flowing through the magnetic core and a support member for supporting an assembly of the magnet, the magnetic core and the coil, the support member comprising a coil bobbin for receiving therein the magnetic core, a sleeve connected at its one end to the coil bobbin and receiving the magnet therein and a terminal disposed at the other end of the sleeve and connected to the coil, and the coil bobbin comprising a flange including lead out ports for allowing lead out wires to extend therethrough, and the lead out ports are circumferentially spaced apart from each other on the flange to prevent a contact of the lead out wires passing therethrough, so that the danger of contacting and short-circuiting between the lead wires between the coil bobbin of the support member and the terminal.

In the magnetic sensor of embodiment 7, the sleeve has formed therein a circumferential groove and the lead out wires are wound into the circumferential groove, so that the lead out wires are not axially dislocated on the sleeve, preventing the short-circuiting and the wire breaking fault due to the contact between the lead out wires.

In the magnetic sensor of embodiment 8, the sleeve has formed therein an axial groove and the lead out wires are wound into the axial groove, the lead out wires are not circumferenetially dislocated on the sleeve, preventing the short-circuiting and the wire breaking fault due to the contact between the lead out wires.

In the magnetic sensor of embodiment 9, the sleeve comprises an engaging projection and the lead out wires are wound around the engaging projection and wound onto the sleeve, so that the lead out wires are not circumferentially dislocated on the sleeve, preventing the short-circuiting and the wire breaking fault due to the contact between the lead out wires.

In the magnetic sensor of embodiment 10, the engaging projection comprises an engaging groove and the lead out wires extend through the engaging groove, so that the lead out wires are not axially nor circumferentially dislocated on the sleeve, preventing the short-circuiting and the wire breaking fault due to the contact between the lead out wires.

The magnetic sensor of embodiment 11 comprises a sensor assembly, and a resin molding member surrounding the sensor assembly and defining a housing, the sensor assembly comprising a magnet for generating a magnetic flux, a magnetic core for defining a magnetic circuit, a coil wound around the magnetic core for detecting the change in the magnetic flux flowing through the magnetic core and a support member for supporting an assembly of the magnet, the magnetic core and the coil, the support member comprising a coil bobbin for receiving therein the magnetic core, a sleeve connected at its one end to the coil bobbin and receiving the magnet therein, a terminal bed disposed at the other end of the sleeve and a terminal disposed to the terminal bed and connected to the coil, and the terminal bed has formed therein a recessed portion, so that the interface facing to the resin molding member has a complex configuration and a large surface area, providing a good contact.

The magnetic sensor of embodiment 12 comprises a sensor assembly, and a resin molding member surrounding the sensor assembly and defining a housing, the sensor assembly comprising a magnet for generating a magnetic flux, a magnetic core for defining a magnetic circuit, a coil wound around the magnetic core for detecting the change in the magnetic flux flowing through the magnetic core and a support member for supporting an assembly of the magnet, the magnetic core and the coil, the support member comprising a coil bobbin for receiving therein the magnetic core, a sleeve connected at its one end to the coil bobbin and receiving the magnet therein and a terminal disposed at the other end of the sleeve and connected to the coil, and the terminal projects radially outward of the outer diameter of the coil bobbin, the solder impregnation into a solder bath can be carried out, making the soldering easier and allow the automation.

The magnetic sensor of embodiment 13 comprises a sensor assembly, and a resin molding member surrounding the sensor assembly and defining a housing, the sensor assembly comprising a magnet for generating a magnetic flux, a magnetic core for defining a magnetic circuit, a coil wound around the magnetic core for detecting the change in the magnetic flux flowing through the magnetic core and a support member for supporting an assembly of the magnet, the magnetic core and the coil, the support member comprising a coil bobbin for receiving therein the magnetic core, a sleeve connected at its one end to the coil bobbin and receiving the magnetic core and the magnet therein, a spacer for holding the magnetic core and said magnet within the sleeve and a terminal disposed at the other end of the sleeve and connected to the coil, and the sleeve has provided on its inner circumferential surface with a small-diameter portion for holding the spacer by pressure fit, so that the magnetic core, the magnet and the spacer are supported within the support member by pressure fit without using the bonding agent, allowing the automation.

In the magnetic sensor of embodiment 13, the small-diameter portion is a projection projected from the inner peripheral surface of the spacer, so that the insertion for the pressure fit is easy.

The magnetic sensor of embodiment 14 comprises a sensor assembly, and a resin molding member surrounding the sensor assembly and defining a housing, the sensor assembly comprising a magnet for generating a magnetic flux, a magnetic core for defining a magnetic circuit, a coil wound around the magnetic core for detecting the change in the magnetic flux flowing through the magnetic core and a support member for supporting an assembly of the magnet, the magnetic core and the coil, the support member comprising a coil bobbin for receiving therein the magnetic core and a sleeve connected at its one end to the coil bobbin and receiving the magnetic core and the magnet therein, and further comprising between the magnetic core and the sleeve a positioning means engaging each other for positioning the magnetic core relative to the sleeve, so that the stop for the rotation of the magnetic core relative to the sleeve can be provided to allow a higher accuracy of the magnetic sensor.

The magnetic sensor of embodiment 15 comprises a sensor assembly including a magnetic core, and a resin molding member surrounding the sensor assembly and defining a housing for the magnetic sensor, the resin molding member comprising a positioning means disposed in the vicinity of the magnetic core, so that the positioning can be achieved at a very high accuracy.

In the magnetic sensor of embodiment 15, the positioning means comprises a positioning pin extending at right angles relative to the axis of the magnetic sensor, so that the magnetic sensor can be arranged in parallel to the mounting bed without the need for passing through the mounting bed as done in the related sensor, allowing a higher degree of freedom in arrangement.

The magnetic sensor of embodiment 16 comprises a sensor assembly including a magnetic core, a resin molding member surrounding the sensor assembly with one end of the magnetic core projected and defining a housing for the magnetic sensor, and a cover at least partially surrounding a side surface of the one end of the magnetic core projected from the resin molding member, so that the magnetic attraction of any magnetic foreign matters to the magnetic core can be prevented, preventing the degrading of the signal accuracy of the magnetic sensor and improving the erosion resistivity.

The magnetic sensor of embodiment 17 comprises a sensor assembly, and a resin molding member surrounding the sensor assembly and defining a housing, the sensor assembly comprising a magnet for generating a magnetic flux, a magnetic core for defining a magnetic circuit, a coil wound around the magnetic core for detecting the change in the magnetic flux flowing through the magnetic core and a support member for supporting an assembly of the magnet, the magnetic core and the coil, the support member comprising a coil bobbin for receiving therein the magnetic core, a sleeve connected at its one end to the coil bobbin and receiving the magnetic core and the magnet therein, a spacer for holding the magnetic core and the magnet within the sleeve, a terminal disposed at the other end of the sleeve and connected to the coil and a cap for holding the spacer within the sleeve, so that the magnetic core, the magnet and the spacer can be held within the sleeve before resin molding, so that the automation can be achieved.

The magnetic sensor of embodiment 18 comprises a sensor assembly, and a resin molding member surrounding the sensor assembly and defining a housing, the sensor assembly comprising a magnet for generating a magnetic flux, a magnetic core for defining a magnetic circuit, a coil wound around the magnetic core for detecting the change in the magnetic flux flowing through the magnetic core and a support member including a coil bobbin for supporting an assembly of the magnet, the magnetic core and the coil, and the coil bobbin comprising a resin passage for allowing the flow of molten resin therethrough during the resin molding, so that the molten resin is not obstacle by the coil bobbin during the resin molding, improving the flow of the molten resin, allowing the magnetic sensor to be made small and improving the yield of the product.

What is claimed is:

1. A magnetic sensor comprising:

a sensor assembly; and a resin molding surrounding said sensor assembly and defining a housing;

said sensor assembly comprising a magnet for generating a magnetic flux, a magnetic core for defining a magnetic circuit, a coil for detecting the change in the magnetic flux flowing through said magnetic core and a support member for supporting an assembly of said magnet, said magnetic core and said coil;

said support member comprising a coil bobbin for receiving therein said magnetic core, a sleeve connected at its said one end to said coil bobbin and having a bore for receiving said magnet therein, a terminal bed disposed at the other end of said sleeve and a terminal connected to said terminal bed and electrically connected to said coil; and said terminal bed having formed therein a cavity portion, laterally spaced from said bore of said sleeve, for receiving a portion of said resin molding therein, thereby increasing contact area between said resin molding and said terminal bed.

2. The magnetic sensor defined in claim 1, wherein said cavity portion is an elongated groove.

3. A magnetic sensor comprising:

a sensor assembly; and a resin molding surrounding said sensor assembly and defining a housing;

said sensor assembly comprising a magnet for generating a magnetic flux, a magnetic core for defining a magnetic circuit, a coil for detecting the change in the magnetic flux flowing through said magnetic core and a support member for supporting an assembly of said magnet, said magnetic core and said coil;

said support member comprising a coil bobbin for receiving therein said magnetic core, a sleeve connected at its said one end to said coil bobbin and having a bore for receiving said magnet therein, a terminal bed disposed at the other end of said sleeve and a terminal connected to said terminal bed and electrically connected to said coil; and said terminal bed having formed therein a cavity portion for receiving a portion of said resin molding therein, thereby increasing contact area between said resin molding and said terminal bed;

wherein said cavity portion is a plurality of elongated grooves formed along each side of said terminal bed to surround said bore of said sleeve.

* * * * *